(12) United States Patent
Yamada et al.

(10) Patent No.: US 12,058,872 B2
(45) Date of Patent: Aug. 6, 2024

(54) INTEGRATED DEVICE AND NEUROMORPHIC DEVICE

(71) Applicant: TDK CORPORATION, Tokyo (JP)

(72) Inventors: Shogo Yamada, Tokyo (JP); Tatsuo Shibata, Tokyo (JP); Tomoyuki Sasaki, Tokyo (JP)

(73) Assignee: TDK CORPORATION, Tokyo (JP)

(*) Notice: Subject to any disclaimer, the term of this patent is extended or adjusted under 35 U.S.C. 154(b) by 693 days.

(21) Appl. No.: 17/207,236

(22) Filed: Mar. 19, 2021

(65) Prior Publication Data
US 2022/0005866 A1 Jan. 6, 2022

Related U.S. Application Data

(63) Continuation-in-part of application No. PCT/JP2020/026216, filed on Jul. 3, 2020.

(51) Int. Cl.
*H01L 27/22* (2006.01)
*G06N 3/063* (2023.01)
(Continued)

(52) U.S. Cl.
CPC ............. *H10B 61/00* (2023.02); *G06N 3/063* (2013.01); *G06N 3/065* (2023.01); *G06N 3/08* (2013.01);
(Continued)

(58) Field of Classification Search
CPC ... G11C 11/02–18; G11C 11/54; H10B 61/00; H10B 61/22; H10N 50/80;
(Continued)

(56) References Cited

U.S. PATENT DOCUMENTS 8,786,040 B2* 7/2014 Doyle ................... H10B 61/00
365/158
11,410,714 B2* 8/2022 Luo ........................ H10B 61/00
(Continued)

FOREIGN PATENT DOCUMENTS

JP 2002-359355 A 12/2002
JP 2002359355 A * 12/2002 ............. G11C 11/14
(Continued)

OTHER PUBLICATIONS

Machine translation, Kitamura, Japanese Pat. Pub. No. JP2002359355A, translation date: Nov. 20, 2023, Espacenet, all pages. (Year: 2023).*
(Continued)

*Primary Examiner* — Victoria K. Hall
(74) *Attorney, Agent, or Firm* — Oliff PLC

(57) ABSTRACT

An integrated device includes: a substrate; and a laminated structural body. The substrate has a plurality of switching elements. The laminated structural body has a plurality of magnetic elements having a first element group disposed in a first hierarchical layer and a second element group disposed in a second hierarchical layer. Each of the plurality of magnetic elements includes a conductive layer and a laminated body including a ferromagnetic layer. The plurality of switching elements include a plurality of first switching elements connected to first ends of the conductive layers and a plurality of second switching elements connected to second ends of the conductive layers. A first switching element connected to a second magnetic element belonging to a second element group which is present between a first switching element and a second switching element connected to a first magnetic element belonging to a first element group.

19 Claims, 27 Drawing Sheets

(51) Int. Cl.
*G06N 3/065* (2023.01)
*G06N 3/08* (2023.01)
*G11C 11/16* (2006.01)
*G11C 11/54* (2006.01)
*H01L 43/02* (2006.01)
*H01L 43/08* (2006.01)
*H10B 61/00* (2023.01)
*H10N 50/10* (2023.01)
*H10N 50/80* (2023.01)
*H10N 59/00* (2023.01)
*G06N 3/044* (2023.01)

(52) U.S. Cl.
CPC ...... *G11C 11/1655* (2013.01); *G11C 11/1657* (2013.01); *G11C 11/1659* (2013.01); *G11C 11/54* (2013.01); *H10B 61/22* (2023.02); *H10N 50/10* (2023.02); *H10N 50/80* (2023.02); *H10N 59/00* (2023.02); *G06N 3/044* (2023.01)

(58) Field of Classification Search
CPC ........ H10N 50/10; H10N 59/00; G06N 3/063; G06N 3/08; G06N 3/044; G06N 3/065
See application file for complete search history.

(56) References Cited

U.S. PATENT DOCUMENTS

| | | | | |
|---|---|---|---|---|
| 11,749,328 | B2* | 9/2023 | Luo | H10N 50/85 |
| | | | | 257/421 |
| 11,758,826 | B2* | 9/2023 | Yamada | H10B 61/22 |
| | | | | 365/158 |
| 2011/0129691 | A1 | 6/2011 | Ishiwata et al. | |
| 2014/0016390 | A1* | 1/2014 | Zhao | G11C 11/1675 |
| | | | | 365/63 |
| 2014/0175583 | A1* | 6/2014 | Doyle | H01L 29/82 |
| | | | | 257/427 |
| 2017/0069684 | A1* | 3/2017 | Suh | H10B 61/00 |
| 2017/0256584 | A1* | 9/2017 | Sanuki | H10N 50/01 |
| 2017/0331484 | A1 | 11/2017 | Kudo | |
| 2020/0334015 | A1 | 10/2020 | Shibata et al. | |
| 2021/0110857 | A1* | 4/2021 | Endoh | H10B 61/22 |
| 2021/0296573 | A1* | 9/2021 | Manfrini | H10B 61/10 |
| 2022/0051708 | A1* | 2/2022 | Yamada | H10B 61/22 |
| 2022/0109101 | A1* | 4/2022 | Yamada | H10N 50/10 |
| 2022/0130900 | A1* | 4/2022 | Terasaki | H10B 99/00 |
| 2022/0188618 | A1* | 6/2022 | Yamada | H10B 99/00 |
| 2023/0215480 | A1* | 7/2023 | Shiokawa | H10B 99/00 |
| | | | | 365/209 |

FOREIGN PATENT DOCUMENTS

| | | |
|---|---|---|
| JP | 5441005 B2 | 3/2014 |
| JP | 2017-204833 A | 11/2017 |
| WO | 2016/159017 A1 | 10/2016 |
| WO | 2019/176540 A1 | 9/2019 |
| WO | 2019/188252 A1 | 10/2019 |

OTHER PUBLICATIONS

Translation, Written Opinion of the International Searching Authority, International Searching Authority, International application No. PCT/JP2020/026216, Sep. 24, 2020, all pages. (Year: 2020).*

Translation, International Search Report, International Searching Authority, International application No. PCT/JP2020/026216, Sep. 24, 2020, all pages. (Year: 2020).*

* cited by examiner

INTEGRATED DEVICE AND NEUROMORPHIC DEVICE

TECHNICAL FIELD

The present invention relates to an integrated device and a neuromorphic device.

BACKGROUND ART

Magnetoresistive effect elements using changes in a resistance value (changes in magnetoresistance) based on changes in a relative angle of magnetization of two ferromagnetic layers are known. There are magnetoresistive effect elements in which a current path at the time of writing data and a current path at the time of reading data are different. In such magnetoresistive effect elements, in order to control currents of the different current paths, three switching elements are connected. A magnetoresistive effect element controlled by three switching elements is referred to as a magnetoresistive effect element of a three terminal type.

For example, a magnetic recording element using a spin orbit torque described in Patent Literature 1 is one example of a magnetoresistive effect element of a three terminal type. In addition, for example, a magnetoresistive effect element of a domain wall displacement type described in Patent Literature 2 is one example of a magnetoresistive effect element of a three terminal type.

CITATION LIST

Patent Literature

[Patent Literature 1]
Japanese Unexamined Patent Application, First Publication No. 2017-204833
[Patent Literature 2]
Japanese Patent No. 5441005

SUMMARY OF INVENTION

Technical Problem

Magnetoresistive effect elements are frequently used in a manner in which they are integrated. There is demand to increase a degree of integration in integrated devices in which magnetoresistive effect elements are integrated.

An area occupied by magnetoresistive effect elements and an area occupied by switching elements controlling magnetoresistive effect elements have an influence on the degree of integration of an integrated device. A magnetoresistive effect element of the three-terminal type frequently has a shape that is longer in one direction, and there are many cases in which the shape of an area occupied by magnetoresistive effect elements of a three terminal type does not coincide with the shape of an area occupied by switching elements. It is difficult to integrate such elements in which the shapes of occupancy areas are different with a high density.

The present invention has been realized in view of the problems described above, and an object thereof is to provide an integrated device and a neuromorphic device having a high degree of integration.

Solution to Problem (1) An integrated device according to a first aspect includes: a substrate; and a laminated structural body stacked on the substrate. The substrate has a plurality of switching elements. The laminated structural body has a plurality of magnetic elements. The plurality of magnetic elements have a first element group disposed in a first hierarchical layer and a second element group disposed in a second hierarchical layer different from the first hierarchical layer. Each of the plurality of magnetic elements includes a conductive layer and a laminated body including a ferromagnetic layer connected to the conductive layer. The plurality of switching elements include a plurality of first switching elements respectively connected to first ends of the conductive layers of the plurality of magnetic elements and a plurality of second switching elements respectively connected to second ends of the conductive layers of the plurality of magnetic elements. The first switching element connected to a second magnetic element that is one of magnetic elements belonging to the second element group is present between the first switching element and the second switching element connected to a first magnetic element that is one of the magnetic elements belonging to the first element group in a first direction from the first switching element connected to the first magnetic element to the second switching element connected to the first magnetic element.

(2) In the integrated device according to the aspect described above, the second switching element connected to the first magnetic element may be present between the first switching element connected to the second magnetic element and a second switching element connected to the second magnetic element in the first direction.

(3) In the integrated device according to the aspect described above, the first switching element connected to the second magnetic element may be present at a position deviating from a segment connecting the first switching element connected to the first magnetic element and the second switching element connected to the first magnetic element in a second direction that intersects the first direction.

(4) In the integrated device according to the aspect described above, a straight line connecting the first end and the second end of the conductive layer of the first magnetic element may intersect a straight line connecting the first end and the second end of the conductive layer of the second magnetic element.

(5) In the integrated device according to the aspect described above, the first magnetic element and the second magnetic element may partly overlap each other when seen in a stacking direction of the laminated structural body.

(6) In the integrated device according to the aspect described above, the plurality of switching elements may further include a plurality of third switching elements respectively connected to the laminated bodies of the plurality of magnetic elements.

(7) In the integrated device according to the aspect described above, the laminated structural body may further include an in-plane wiring that extends in one in-plane direction intersecting a stacking direction of the laminated structural body, and the in-plane wiring may be present between the substrate and the first hierarchical layer or the second hierarchical layer and between the first hierarchical layer and the second hierarchical layer.

(8) In the integrated device according to the aspect described above, one of the magnetic elements belonging to the first element group and one of the magnetic elements belonging to the second element group may be connected through a wiring.

(9) In the integrated device according to the aspect described above, the wiring may have a vertical switching element.

(10) In the integrated device according to the aspect described above, the laminated structural body may further include a through wiring, and the through wiring may connect different hierarchical layers or a specific hierarchical layer and the substrate.

(11) In the integrated device according to the aspect described above, an output of the first element group may be input to the second element group.

(12) In the integrated device according to the aspect described above, the conductive layer includes a ferromagnetic substance, and the laminated body may have a non-magnetic layer and a ferromagnetic layer in order from a side close to the conductive layer.

(13) In the integrated device according to the aspect described above, the laminated body may have a first ferromagnetic layer, a non-magnetic layer, and a second ferromagnetic layer in order from a side close to the conductive layer.

(14) In the integrated device according to the aspect described above, in two magnetic elements that are adjacent in a second direction intersecting the first direction and that are present in different hierarchical layers, a position of the first end of the conductive layer of the magnetic element present in the first hierarchical layer and a position of the first end of the conductive layer of the magnetic element present in the second hierarchical layer in the first direction may deviate from each other.

(15) In the integrated device according to the aspect described above, in two magnetic elements that are adjacent in a second direction intersecting the first direction and that are present in different hierarchical layers, a position of the first end of the conductive layer of the magnetic element present in the first hierarchical layer and a position of the first end of the conductive layer of the magnetic element present in the second hierarchical layer in the first direction may coincide with each other.

(16) In the integrated device according to the aspect described above, the plurality of switching elements may be arranged in a matrix pattern, and switching elements connected to the magnetic element belonging to the first hierarchical layer and switching elements connected to the magnetic element belonging to the second hierarchical layer may be alternately aligned in at least one of a row direction and a column direction.

(17) In the integrated device according to the aspect described above, one of the magnetic elements belonging to the first element group and one of the magnetic elements belonging to the second element group may be connected to the same switching element.

(18) A neuromorphic device according to a second aspect includes the integrated device according to the aspect described above.

(19) In the neuromorphic device according to the aspect described above, each of the first element group and the second element group may be responsible for an operation between different intermediate layers in a neural network.

(20) The neuromorphic device according to the aspect described above may further include a comparison device comparing an output of the first element group with an output of the second element group, in which signs of a weight applied to the first element group and a weight applied to the second element group may be different from each other.

Advantageous Effects of Invention

An integrated device and a neuromorphic device according to the aspect described above have a high degree of integration.

DESCRIPTION OF EMBODIMENTS

Hereinafter, this embodiment will be described in detail with appropriate reference to drawings. There are cases in which the drawings used in the following description are represented with characteristic parts being enlarged for convenience in order to make the characteristics easier to understand, and the dimensional ratios between respective constituent elements may be different from the actual ones. Materials, dimensions, and the like illustrated in the following description are examples, and the present invention is not limited thereto. The materials, the dimensions, and the like may be appropriately changed in a range in which effects of the present invention are acquired.

First, directions will be defined. One direction of one face of a substrate Sb (see FIG. 4) is defined as an x direction, and a direction that is orthogonal to the x direction is defined as a y direction. For example, the x direction is a row direction in which a plurality of switching elements are aligned. The x direction may coincide with a direction (first direction) in which a conductive layer of a magnetic element extends. For example, the y direction is a column direction in which a plurality of switching elements are aligned. For example, the y direction is a second direction. A z direction is a direction that is orthogonal to the x direction and the y direction. The z direction is an example of a stacking direction. Hereinafter, a +z direction may be represented as "up", and a −z direction may be represented as "down". The +z direction is a direction of moving away from the substrate Sb. Upwards and downwards do not necessarily coincide with the direction in which the force of gravity is applied.

In addition, in this specification, "extending in a first direction" represents that a length in the first direction is longer than lengths in the other directions. In this specification, "connection" is not limited to direct connection and includes connection through an interposing layer.

First Embodiment

Figure 1:
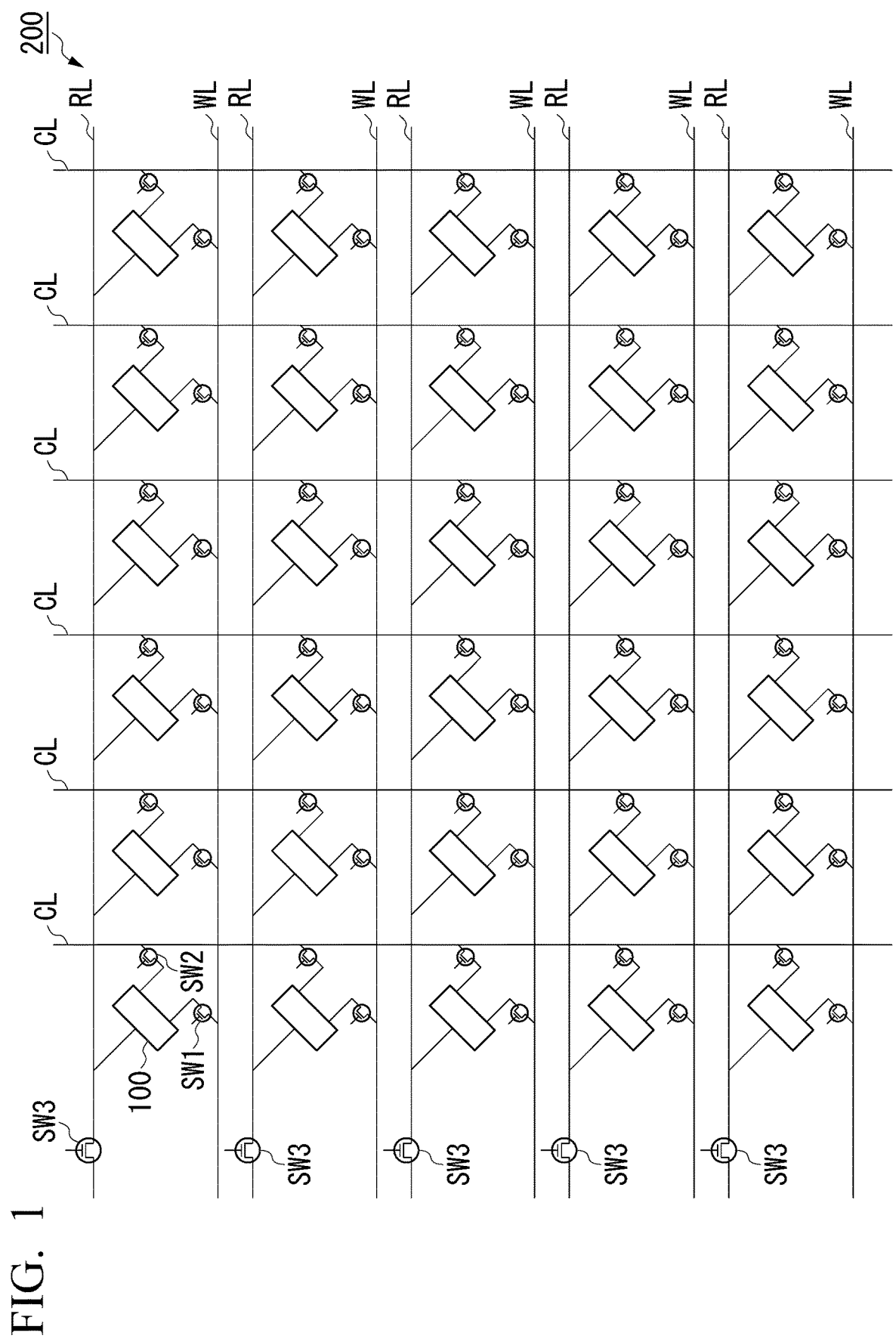
FIG. 1 is a circuit diagram of an integrated device according to a first embodiment.

FIG. 1 is a circuit diagram of an integrated device 200 according to a first embodiment. The integrated device 200 includes a plurality of domain wall displacement elements 100, a plurality of first switching elements SW1, a plurality of second switching elements SW2, a plurality of third switching elements SW3, a plurality of write lines WL, a plurality of read lines RL, and a plurality of common lines CL. The domain wall displacement element 100 is an example of a magnetic element.

For example, the domain wall displacement elements 100 may be arranged in a matrix pattern. One domain wall displacement element 100 is connected to one first switching element SW1, one second switching element SW2, and one third switching element SW3. Any one of the first switching elements SW1, the second switching elements SW2, and the third switching elements SW3 may be connected to a plurality of domain wall displacement elements 100.

When the first switching element SW1 and the second switching element SW2 connected to a specific domain wall displacement element 100 are turned on, data is written into the specific domain wall displacement element 100. In addition, when the second switching element SW2 and the third switching element SW3 connected to a specific domain wall displacement element 100 are turned on, data written into the specific domain wall displacement element 100 is read.

For example, each of the first switching element SW1, the second switching element SW2, and the third switching element SW3 is a field effect transistor. For example, each of the first switching element SW1, the second switching element SW2, and the third switching element SW3 may be an element using a phase change of a crystal layer such as an ovonic threshold switch (OTS), an element using a change in the band structure such as a metal insulator transition (MIT) switch, an element using a breakdown voltage such as a Zener diode and an avalanche diode, or an element of which conductivity changes in accordance with a change in atomic positions.

For example, the first switching element SW1 is present between the write line WL and the domain wall displacement element 100. For example, the second switching element SW2 is connected between the common line CL and the domain wall displacement element 100. For example, the third switching element SW3 is connected to the read line RL. The read line RL is a wiring through which a current flows when data is read. The write line WL is a wiring through which a current flows when data is written. The common line CL is a wiring through which a current flows either at the time of writing data or at the time of reading data.

Figure 2:
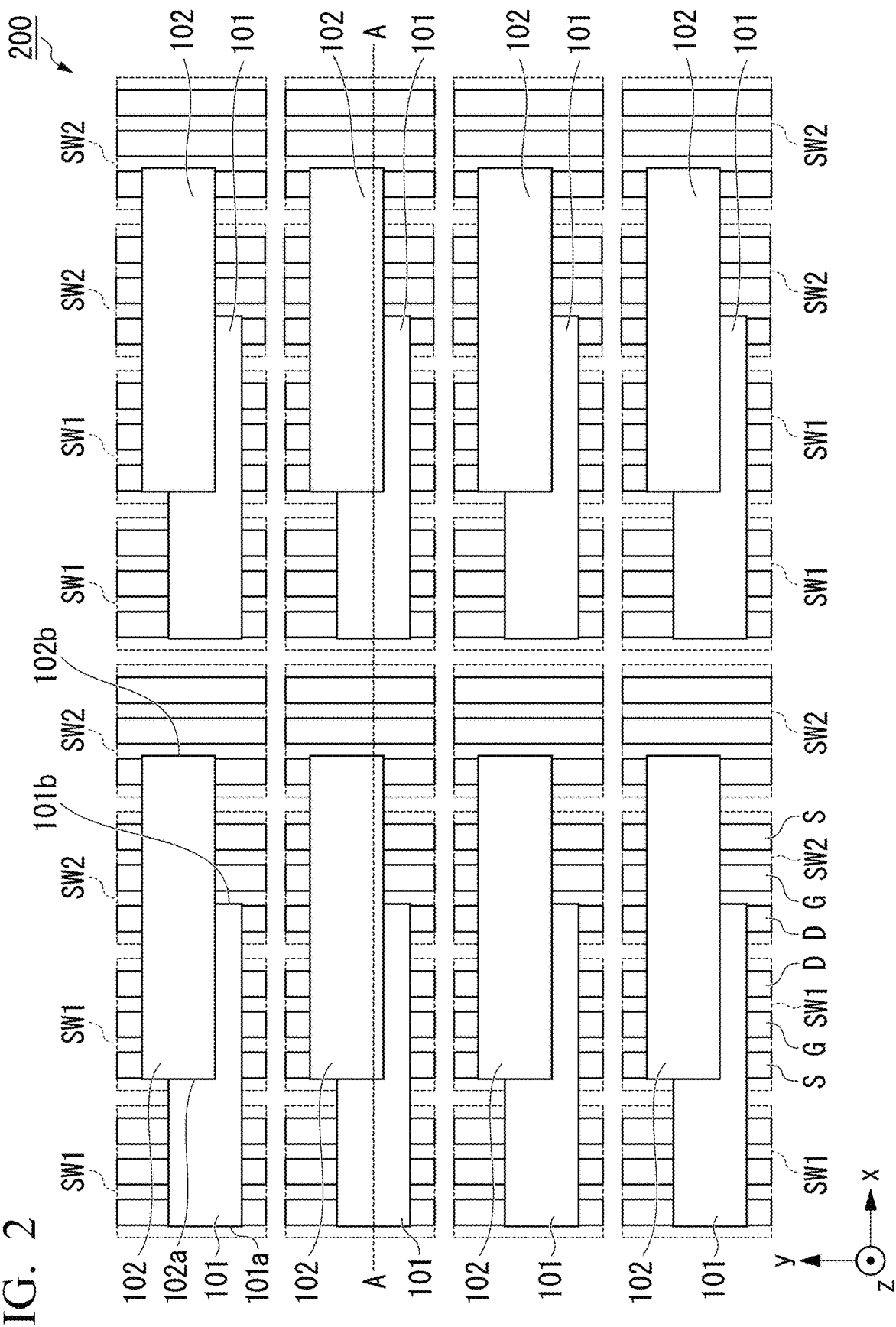
FIG. 2 is a plan view of characteristic parts of the integrated device according to the first embodiment.
Figure 3:
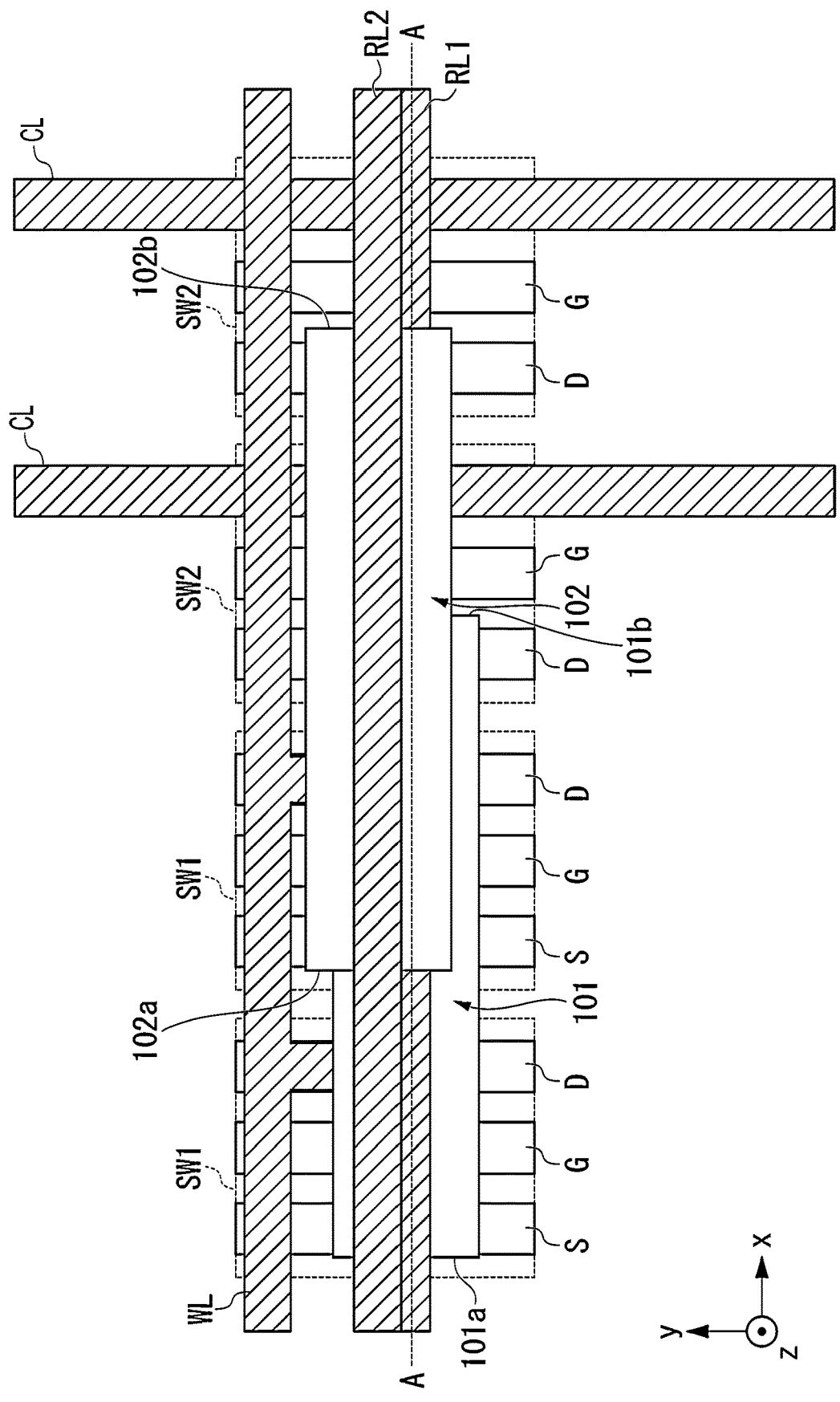
FIG. 3 is an enlarged plan view of an area near two magnetic elements of the integrated device according to the first embodiment.
Figure 4:
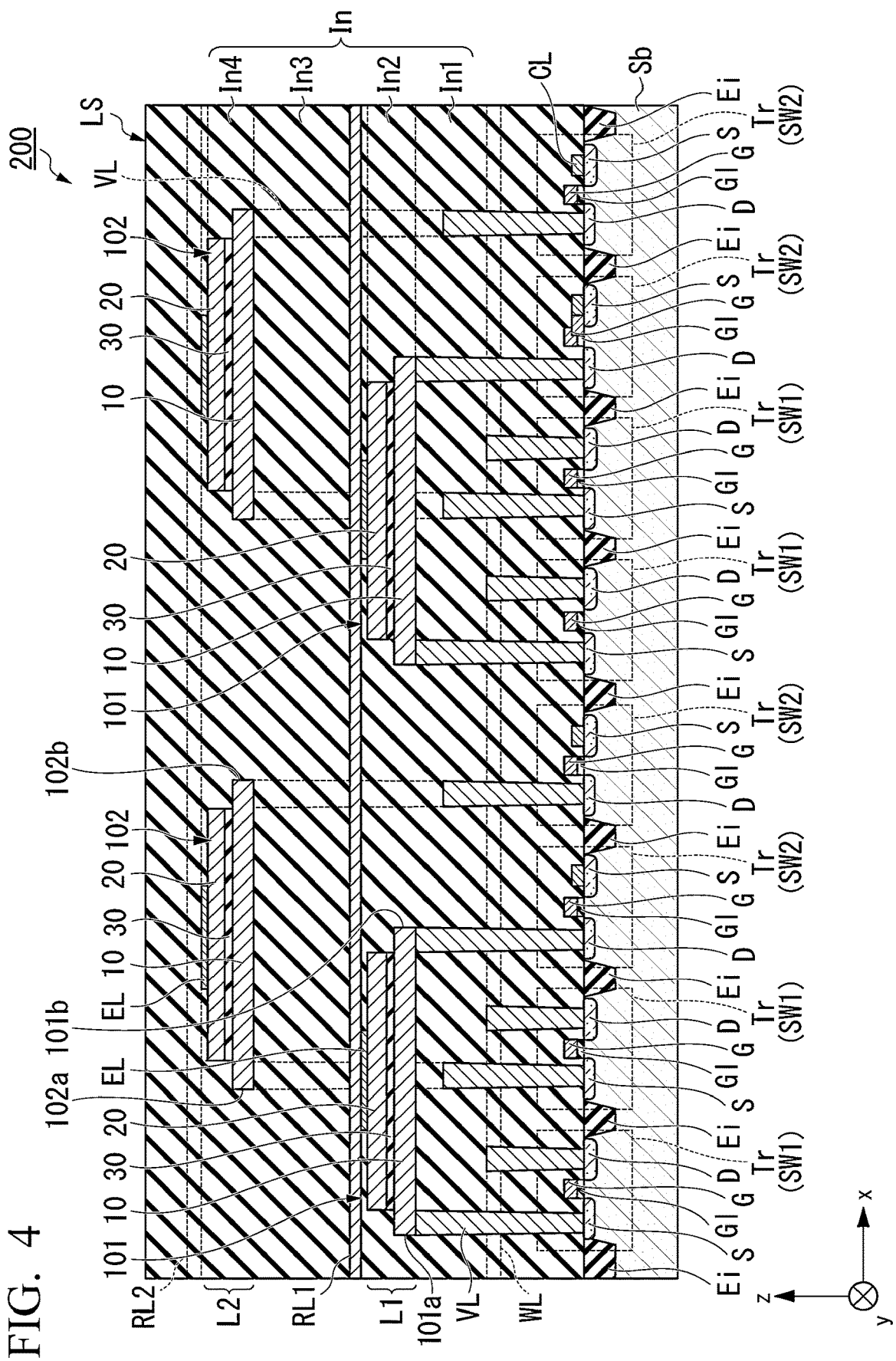
FIG. 4 is a cross-sectional view of characteristic parts of the integrated device according to the first embodiment.
Figure 5:
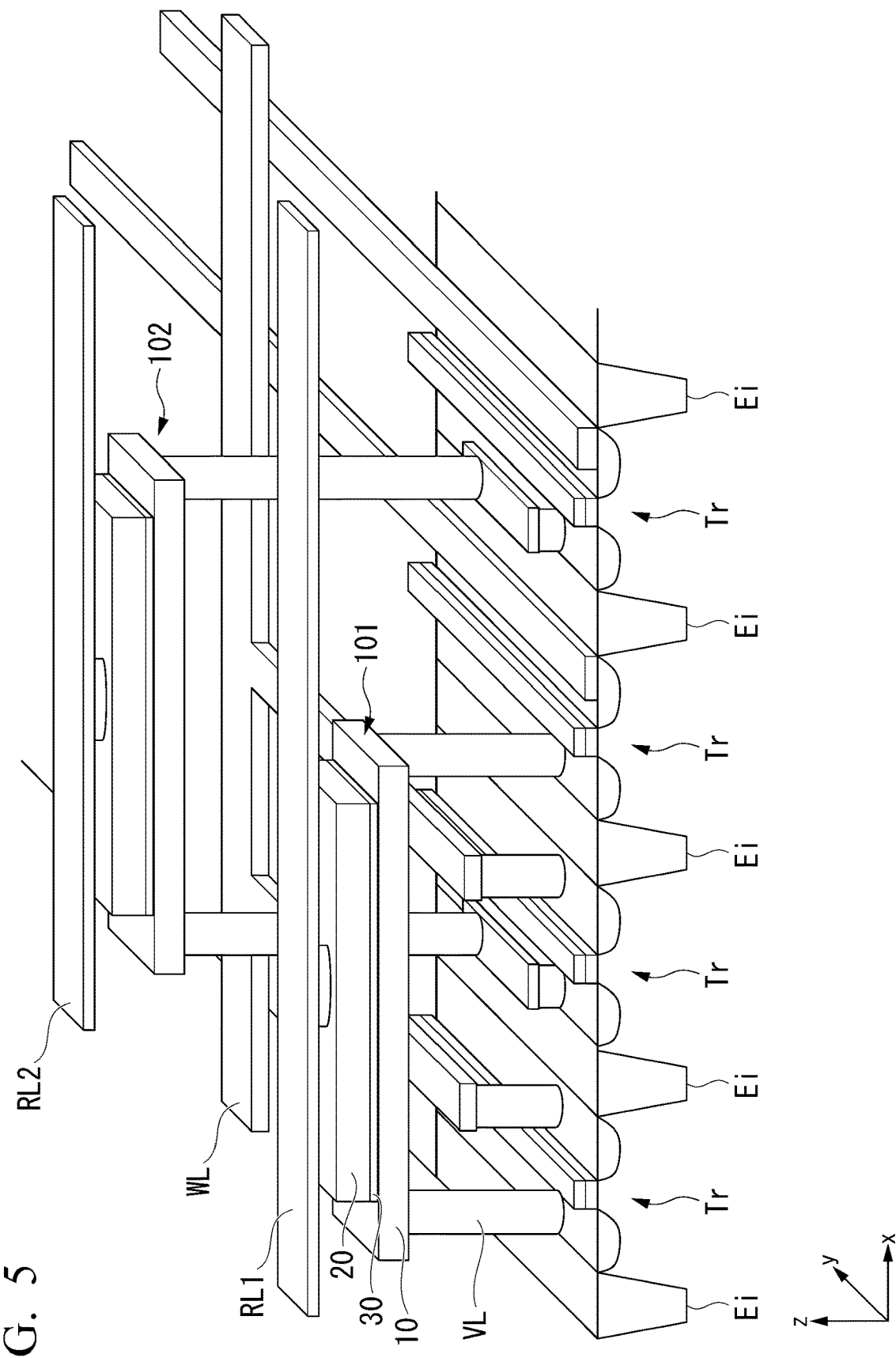
FIG. 5 is a perspective view of characteristic parts of the integrated device according to the first embodiment.

FIG. 2 is a plan view of characteristic parts of the integrated device 200 according to the first embodiment. FIG. 2 is illustrated with the read lines RL, the write lines WL, and the common lines CL excluded. FIG. 3 is an enlarged plan view of an area near two domain wall displacement elements 101 and 102 of the integrated device 200 according to the first embodiment. FIG. 4 is a cross-sectional view of characteristic parts of the integrated device 200 according to the first embodiment. FIG. 4 is an xz cross-section taken along a line A-A in FIGS. 2 and 3. FIG. 5 is a perspective view of characteristic parts of the integrated device 200. FIG. 5 is illustrated with an insulator In excluded. Each of the domain wall displacement elements 101 and 102 is an example of the domain wall displacement element 100.

The integrated device 200 includes a substrate Sb and a laminated structural body LS. The laminated structural body LS is present on the substrate Sb.

For example, the substrate Sb is a semiconductor substrate. The substrate Sb includes a plurality of switching elements. The plurality of switching elements are insulated from each other by inter-element insulators Ei. The plurality of switching elements control a plurality of domain wall displacement elements 101 and 102 belonging to each of a first element group and a second element group to be described below. The plurality of switching elements do not need to control all the plurality of domain wall displacement elements 101 and 102 belonging to the first element group and the second element group and control at least either the domain wall displacement elements 101 or the domain wall displacement elements 102 at each time.

For example, the plurality of switching elements include first switching elements SW1, second switching elements SW2, and third switching elements SW3. The first switching elements SW1 are respectively connected to first ends 101a and 102a of conductive layers 10 of the domain wall displacement elements 101 and 102. The second switching elements SW2 are respectively connected to second ends 101b and 102b of the conductive layers 10 of the domain wall displacement elements 101 and 102. The third switching elements SW3, for example, are present at different positions in the x direction in FIG. 4. The third switching elements SW3, for example, are present in a peripheral area disposed on an outer side of an integration area in which the domain wall displacement elements 101 and 102 are integrated. Hereinafter, a case in which the first switching elements SW1 and the second switching elements SW2 are arranged in a matrix pattern within an integration area will be described as an example.

For example, each of the first switching element SW1 and the second switching element SW2 is a field effect transistor Tr. Hereinafter, the first switching element SW1 and the second switching element SW2 may be simply referred to as transistors Tr without them being distinguished from each other.

For example, the transistors Tr are arranged in a matrix pattern. For example, the transistor Tr has a gate G, a gate insulating film GI, a source S, and a drain D. The gate G is present between the source S and the drain D when seen in the z direction. The gate G controls the flow of electric charge between the source S and the drain D. The source S and the drain D are names defined in accordance with current flowing directions, and the positions are changed in accordance with a current flowing direction. A positional relation between the source S and the drain D illustrated in FIGS. 2 to 5 is an example, and the positional relation between the source S and the drain D of each transistor Tr may be the opposite of this.

The laminated structural body LS includes a plurality of domain wall displacement elements 101 and 102, a wiring, and an insulator In. The laminated structural body LS has a plurality of hierarchical layers. The hierarchical layers are layers that are divided for respective functions. The laminated structural body LS is produced by repeating a lamination process and a working process, and a unit laminated in each lamination process frequently becomes a hierarchical layer. In the laminated structural body LS, for example, a wiring layer including an in-plane wiring and an element layer including domain wall displacement elements are alternately laminated. For example, the element layer includes a first hierarchical layer L1 and a second hierarchical layer L2. The element layer may be composed of three or more layers.

The plurality of the domain wall displacement elements 101 and 102 and the wirings are present inside the insulator In. The insulator In is formed for each hierarchical layer. For example, the insulators In may be divided into insulators In1, In2, In3, and In4 for respective hierarchical layers. The insulator In insulates wirings and elements of a multi-layer wiring from each other. For example, the insulator In may be made of silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), magnesium oxide (MgO), and the like.

The wiring has conductivity. For example, the wiring contains any one selected from the group consisting of Ag, Cu, Co, Al, Au, Ru, and W. As the wirings, there are an in-plane wiring and a via wiring VL. The via wiring VL is an example of a through wiring. The in-plane wiring is a wiring that extends in one direction within an xy plane. The via wiring VL is a wiring that extends in the z direction. For example, the via wiring VL connects elements that are present in different hierarchical layers. The via wiring VL passes through an adjacent hierarchical layer and reaches another hierarchical layer or a substrate having the adjacent hierarchical layer interposed therebetween. For example, the through wiring connects the domain wall displacement element 102 belonging to the second hierarchical layer L2 and the transistor Tr of the substrate Sb and passes through the insulators In1, In2, and In3 in the z direction. For example, the through wiring is continuous in the z direction.

For example, the read lines RL, the write lines WL, and the common lines CL, wirings connecting these and the via wirings VL, and wirings connecting the via wirings VL are in-plane wirings. For example, the in-plane wiring is present between the substrate Sb and the first hierarchical layer L1 and between the first hierarchical layer L1 and the second hierarchical layer L2. For example, the read lines RL extend in the x direction. For example, as the read lines RL, there are read lines RL1 connected to the domain wall displacement elements 101 and read lines RL2 connected to the domain wall displacement elements 102. For example, the read lines RL1 and RL2 are connected to a ferromagnetic layer 20 of the domain wall displacement element 101 and a ferromagnetic layer 20 of the domain wall displacement element 102 through electrodes EL. For example, the write lines WL extend in the x direction. For example, the write line WL is connected to the via wiring VL that reaches the transistor Tr through a wiring extending in the y direction. For example, the common lines CL extend in the y direction.

The domain wall displacement element 101 and the domain wall displacement element 102 are present in different hierarchical layers of the laminated structural body LS. The domain wall displacement elements 101 are present in the first hierarchical layer, and the domain wall displacement elements 102 are present in the second hierarchical layer. There are a plurality of domain wall displacement elements 101 in the first hierarchical layer. An aggregate of the plurality of domain wall displacement elements 101 that are present in the first hierarchical layer will be referred to as a first element group. One of the domain wall displacement elements 101 will be referred to as a first magnetic element. There are a plurality of domain wall displacement elements 102 in the second hierarchical layer. An aggregate of the plurality of domain wall displacement elements 102 that are present in the second hierarchical layer will be referred to as a second element group. One of the domain wall displacement elements 102 will be referred to as a second magnetic element. Each of the domain wall displacement elements 101 and 102 includes a conductive layer 10, a non-magnetic layer 30, and a ferromagnetic layer 20.

For example, each of the domain wall displacement elements 101 and the domain wall displacement elements 102 is connected to one of transistors Tr of the substrate Sb. In the domain wall displacement element 101 and the domain wall displacement element 102, the first ends 101a and 102a of the conductive layers 10 are connected to transistors Tr corresponding to the first switching element SW1, and the second ends 101b and 102b are connected to transistors Tr corresponding to the second switching element SW2. The first switching element SW1 connected to the second magnetic element that is one of the domain wall displacement elements 102 is present between the first switching element SW1 and the second switching element SW2 connected to the first magnetic element that is one of the domain wall displacement elements 101. In addition, the second switching element SW2 connected to the first magnetic element is present between the first switching element SW1 and the second switching element SW2 connected to the second magnetic element.

For example, the transistors Tr that are adjacent to each other in the x direction are connected to the domain wall displacement elements 101 and 102 of different hierarchical layers. For example, the transistors Tr that belong to a first column aligned in the y direction are connected to the first end 101a of one of the domain wall displacement elements 101 desired to be arranged in the first hierarchical layer L1. The transistors Tr that belong to a second column adjacent to the first column are connected to the first end 102a of one of the domain wall displacement elements 102 desired to be arranged in the second hierarchical layer L2. The transistors Tr that belong to a third column adjacent to the second column are connected to the second ends 101b of the domain wall displacement elements 101 connected to the transistors Tr of the first column arranged in the first hierarchical layer L1. The transistors Tr that belong to a fourth column adjacent to the third column are connected to the second ends 102b of the domain wall displacement elements 102 connected to the transistors Tr of the second column arranged in the second hierarchical layer L2. The transistors Tr of the first column and the third column control the domain wall displacement elements 101, and the transistors Tr of the second column and the fourth column control the domain wall displacement elements 102.

In a case in which the domain wall displacement element 101 and the domain wall displacement element 102 are present in the same hierarchical layer, when the transistor Tr of the second column and the first end 102a of the domain wall displacement element 102 are connected using the via wiring VL, there is high concern that the via wiring VL and the domain wall displacement element 101 will come into contact with each other. For this reason, it is difficult to use the transistors Tr of the second column. Thus, in a case in which the domain wall displacement element 101 is controlled by the transistors Tr of the first column and the third column, the domain wall displacement element 102 that is adjacent to the domain wall displacement element 101 in the x direction is controlled by the transistors Tr of the fourth column and the sixth column. In other words, when the domain wall displacement elements 101 and 102 are present in the same hierarchical layer, in order prevent formation of a short circuit, the transistors Tr of the second column and the fifth column cannot be used effectively. In contrast to this, by configuring the domain wall displacement elements 101 and 102 to be present in different layers, the transistors Tr can be fully used, and therefore, the degree of integration of the integrated device 200 is high.

The domain wall displacement element 101 of the first element group illustrated in FIGS. 2 and 3 partly overlap with one of the domain wall displacement elements 102 of the second element group when seen in the z direction. For example, the domain wall displacement element 101 partly overlap with the nearest domain wall displacement element 102 in the x direction when seen in the z direction. By disposing a plurality of domain wall displacement elements 101 and 102 to overlap each other in the z direction, the plurality of domain wall displacement elements 101 and 102 can be housed within a predetermined area in the xy plane having an influence on the degree of integration.

The positions of the first end 101a of the domain wall displacement element 101 and the first end 102a of the domain wall displacement element 102 illustrated in FIGS. 2 and 3 in the x direction deviate from each other. The first end 101a of the domain wall displacement element 101 and the first end 102a of the domain wall displacement element 102 are first ends of the conductive layers 10 composing the domain wall displacement elements 101 and 102. By shifting the positions of the first ends 101a and 102a from each other in accordance with the positions of the transistors Tr of the substrate Sb, wirings connecting the domain wall displacement elements 101 and 102 and the transistors Tr can be drawn around in a simple manner.

Figure 6:
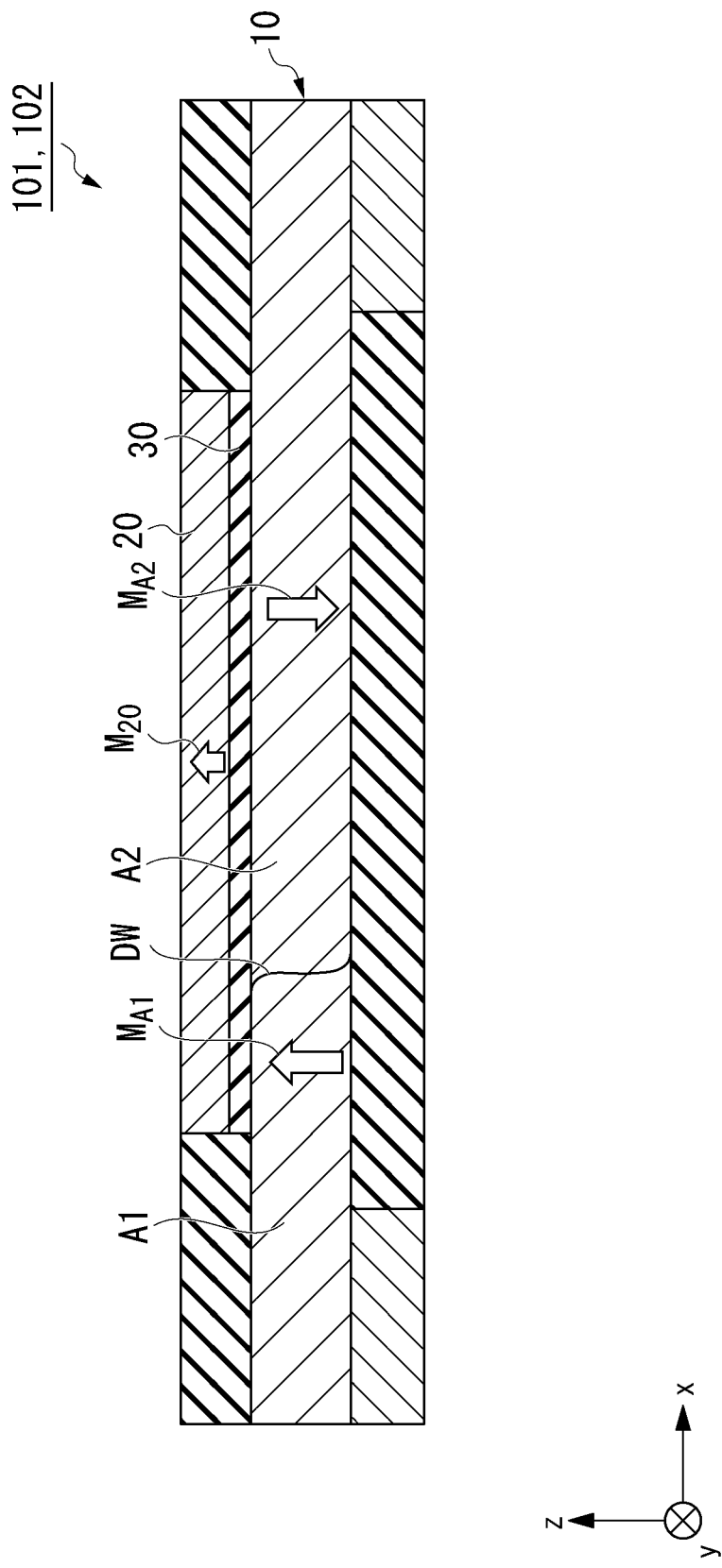
FIG. 6 is a cross-sectional view of a domain wall displacement element according to the first embodiment.

FIG. 6 is a cross-sectional view of the domain wall displacement elements 101 and 102 according to the first embodiment. FIG. 6 illustrates a cross-section of the domain wall displacement elements 101 and 102 taken along an xz plane passing through the center of the width of the conductive layer 10 in the y direction. The configurations of the domain wall displacement elements 101 and 102 are the same. Each of the domain wall displacement elements 101 and 102 has a conductive layer 10, a non-magnetic layer 30, and a ferromagnetic layer 20. A laminated body including the non-magnetic layer 30 and the ferromagnetic layer 20 is stacked on the conductive layer 10. Each of the domain wall displacement elements 101 and 102 is a three terminal-type magnetoresistive effect element and has a length in the x direction that is larger than a length in the y direction.

The conductive layer 10 extends in the x direction. For example, the conductive layer 10 has a rectangular shape having a long axis in the x direction and a short axis in the y direction in the plan view from the z direction. The conductive layer 10 faces the ferromagnetic layer 20 with the non-magnetic layer 30 interposed therebetween. The conductive layer 10 has a first end connected to a first switching element SW1 and a second end connected to a second switching element SW2.

The conductive layer 10 includes a ferromagnetic body. The conductive layer 10 is a layer in which information can be magnetically recorded in accordance with a change in the magnetic state of the inside. The conductive layer 10 is called a magnetic recording layer or a domain wall displacement layer. The conductive layer 10 can have a first magnetic domain A1 and a second magnetic domain A2 having different magnetic states. For example, magnetization $M_{A1}$ of the first magnetic domain A1 and magnetization $M_A$ of the second magnetic domain A2 are oriented in opposite directions. For example, the magnetization $M_{A1}$ of the first magnetic domain A1 is oriented in the +z direction, and the magnetization $M_{A2}$ of the second magnetic domain A2 is oriented in the −z direction. A boundary between the first magnetic domain A1 and the second magnetic domain A2 is a domain wall DW. The conductive layer 10 can have the domain wall DW inside.

Hereinafter, although description will be presented using an example in which magnetization is oriented in the z-axis direction, the magnetization of the conductive layer 10 and the ferromagnetic layer 20 may be oriented in one direction within the xy plane. In a case in which the magnetization is oriented in the z direction, power consumption and operating-time heat generation of the domain wall displacement element are inhibited more than in a case in which the magnetization is oriented within the xy plane. In addition, in a case in which the magnetization is oriented in the z direction, when a pulse current having the same intensity is applied, a movement width of the domain wall DW is smaller than that of a case in which the magnetization is oriented within the xy plane. On the other hand, in a case in which the magnetization is oriented in any one direction within the xy plane, a magneto resistance change width (MR ratio) of the domain wall displacement element is larger than that of a case in which the magnetization is oriented in the z direction.

When the domain wall DW moves, a ratio between the first magnetic domain A1 and the second magnetic domain A2 in the conductive layer 10 changes. By causing a write current to flow through the conductive layer 10 in the x direction, the domain wall DW moves. When a volume ratio between the first magnetic domain A1 and the second magnetic domain A2 in the conductive layer 10 changes, resistance values of the domain wall displacement elements 101 and 102 change. The resistance values of the domain wall displacement elements 101 and 102 change in accordance with a relative angle of magnetization of ferromagnetic layers having the non-magnetic layer 30 interposed therebetween. The domain wall displacement elements 101 and 102 change in accordance with a relative angle between the magnetization $M_{A1}$ and $M_{A2}$ of the conductive layer 10 and magnetization $M_{20}$ of the ferromagnetic layer 20. When the ratio of the first magnetic domain A1 becomes high, the resistance values of the domain wall displacement elements 101 and 102 decrease. When the ratio of the second magnetic domain A2 becomes high, the resistance values of the domain wall displacement elements 101 and 102 increase.

The conductive layer 10 is composed of a magnetic body. The conductive layer 10 may be a ferromagnetic substance, a ferrimagnetic substance, or a combination of these and an antiferromagnetic substance that can change the magnetic state using a current. It is preferable that the conductive layer 10 have at least one element selected from the group consisting of Co, Ni, Fe, Pt, Pd, Gd, Tb, Mn, Ge, and Ga. As materials used for the conductive layer 10, for example, there are a laminated film of Co and Ni, a laminated film of Co and Pt, a laminated film of Co and Pd, a laminated film of CoFe and Pd, a MnGa-based material, a GdCo-based material, and a TbCo-based material. A ferrimagnetic substance such as the MnGa-based material, the GdCo-based material, and the TbCo-based material have low saturation magnetization, and a threshold current that is necessary for moving the domain wall DW is small. In addition, the laminated film of Co and Ni, the laminated film of Co and Pt, the laminated film of Co and Pd, and the laminated film of CoFe and Pd have a large coercive force, and the moving speed of the domain wall DW is low. For example, the antiferromagnetic substance is $Mn_3X$ (here, X is Sn, Ge, Ga, Pt, Ir, or the like), CuMnAs, $Mn_2Au$, or the like. The same material as that of the ferromagnetic layer 20 to be described later can be applied to the conductive layer 10.

The non-magnetic layer 30 is stacked on the conductive layer 10. The non-magnetic layer 30 is present between the conductive layer 10 and the ferromagnetic layer 20.

The non-magnetic layer 30, for example, is formed from a non-magnetic insulating substance, a semiconductor, or a metal having non-magnetization. Examples of the non-magnetic insulating substance include $Al_2O_3$, $SiO_2$, MgO, $MgAl_2O_4$ and materials acquired by substituting parts of such Al, Si, and Mg with Zn, Be, and the like. Such materials have a large band gap and a superior insulating property. In a case in which the non-magnetic layer 30 is formed from a non-magnetic insulator, the non-magnetic layer 30 is a tunnel barrier layer. Examples of the non-magnetic metal include Cu, Au, Ag, and the like. Examples of the non-magnetic semiconductor include Si, Ge, $CuInSe_2$, $CuGaSe_2$, $Cu(In,Ga)Se_2$, and the like.

It is preferable that the thickness of the non-magnetic layer 30 be equal to or larger than 20 Å, and it is more preferable that that thickness be equal to or larger than 30 Å. When the thickness of the non-magnetic layer 30 is large, the resistance area product (RA) of the domain wall displacement elements 101 and 102 is large. It is preferable that the resistance area product (RA) of the domain wall displacement elements 101 and 102 be equal to or larger than $1\times10^4$ $\Omega\mu m^2$, and it is more preferable that the resistance area product be equal to or larger than $1\times10^5$ $\Omega\mu m^2$. The resistance area product (RA) of the domain wall displacement elements 101 and 102 is represented as a product of element resistance of one of the domain wall displacement elements 101 and 102 and an element cross-sectional area (the area of a cut face of the non-magnetic layer 30 taken along the xy plane) of the domain wall displacement elements 101 and 102.

The ferromagnetic layer 20 is present on the non-magnetic layer 30. The ferromagnetic layer 20 has magnetization $M_{20}$ that is oriented in one direction. When a predetermined external force is applied, it is more difficult for the magnetization $M_{20}$ of the ferromagnetic layer 20 to be reversed than the magnetizations $M_{A1}$ and $M_A$ of the first magnetic domain A1 and the second magnetic domain A2. Examples of the predetermined external force include an external force applied to magnetization in accordance with an external magnetic field and an external force applied to magnetization in accordance with a spin polarized current. The ferromagnetic layer 20 may be referred to as a magnetization fixed layer or a magnetization reference layer.

The ferromagnetic layer 20 contains a ferromagnetic substance. For example, the ferromagnetic layer 20 contains a material from which a coherent tunnel effect can be easily acquired between the conductive layer 10 and the ferromagnetic layer 20. For example, the ferromagnetic layer 20 contains a metal selected from the group consisting of Cr, Mn, Co, Fe, and Ni, an alloy containing one or more kinds of such metals, an alloy containing such metals and at least one or more kinds of elements B, C, and N, and the like. For example, the ferromagnetic layer 20 is Co—Fe, Co—Fe—B, or Ni—Fe.

For example, the ferromagnetic layer 20 may be a Heusler alloy. The Heusler alloy is a half metal and has a high spin polarization ratio. The Heusler alloy is an inter-metal compound having a chemical composition of XYZ or $X_2YZ$. X is a transition metal element or a noble metal element of Co, Fe, Ni, or Cu group on a periodic table, Y is a transition metal element of Mn, V, Cr, or Ti group or an element type of X, and Z is a typical element of group III to group V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

On a face of the ferromagnetic layer 20 that is on a side opposite to the non-magnetic layer 30, a magnetic layer may be disposed through a spacer layer. The ferromagnetic layer 20, the spacer layer, and the magnetic layer form a synthetic antiferromagnetic structure (SAF structure). The synthetic antiferromagnetic structure is formed from two magnetic layers having a non-magnetic layer interposed therebetween. At a place at which the ferromagnetic layer 20 and the magnetic layer are antiferromagnetically coupled, the coercive force of the ferromagnetic layer 20 is larger than that of a case in which no magnetic layer is included. For example, the magnetic layer contains a ferromagnetic substance and may contain an antiferromagnetic substance such as IrMn and PtMn. For example, the spacer layer contains at least one selected from the group consisting of Ru, Ir, and Rh.

The direction of magnetization of each of the layers of the domain wall displacement elements 101 and 102 can be checked, for example, by measuring a magnetization curve. The magnetization curve, for example, can be measured using a magneto optical Kerr effect (MOKE). The measurement using the MOKE is a measurement method performed using the magneto optical effect (magnetic Kerr effect) in which linear polarized light is caused to be incident to a measurement target object, and rotation and the like in a polarization direction thereof occur.

Next, a method of manufacturing the integrated device 200 will be described. The integrated device 200 is formed by a lamination process on each layer and a working process in which a part of each layer is processed into a predetermined shape. For the lamination of each layer, a sputtering method, a chemical vapor deposition (CVD) method, an electronic beam vapor deposition method (EB vapor deposition method), an atom laser deposition method, or the like can be used. The processing of each layer can be performed using photolithography or the like.

First, sources S and drains D are formed by doping impurities at predetermined positions in a substrate Sb. Next, a gate insulating film GI and a gate G are formed between each source S and each drain D. The source S, the drain D, the gate insulating film GI, and the gate G form a transistor Tr. As the substrate Sb, a semiconductor substrate that is commercially available in which transistors Tr are periodically aligned may be used.

Next, a wiring layer up to a first hierarchical layer L1 is formed. The wiring layer can be manufactured using photolithography.

Next, a first element group of the first hierarchical layer L1 is manufactured. First, a ferromagnetic layer, a non-magnetic layer, and a ferromagnetic layer are sequentially stacked, and these are processed into a predetermined shape. The ferromagnetic layer, the non-magnetic layer, and the ferromagnetic layer respectively form the conductive layer 10, the non-magnetic layer 30, and the ferromagnetic layer 20. Also, the first element group can be manufactured using photolithography.

Next, in a similar procedure, by manufacturing a wiring layer between the first hierarchical layer L1 and the second hierarchical layer L2 and a second element group of the second hierarchical layer, an integrated device 200 can be obtained.

The integrated device 200 according to the first embodiment has a superior degree of integration. Each of the domain wall displacement elements 101 and 102 is a three terminal-type magnetoresistive effect element and has a length in the x direction that is larger than a length in the y direction. For this reason, when seen in the z direction, the shape of the area occupied by the domain wall displacement elements 101 and 102 and the shape of the area occupied by the transistor Tr are different from each other. It is difficult to integrate two elements having different occupancy areas while electrical connection thereof is secured. As a result, as described above, there are cases in which some of the transistors Tr that are regularly aligned cannot be used. In contrast to this, in the integrated device 200 according to the first embodiment, the domain wall displacement elements 101 and 102 are formed in different hierarchical layers. For this reason, the domain wall displacement elements 101 and 102 can be manufactured in accordance with the array of the transistors Tr in the substrate Sb. As a result, the transistors Tr of the substrate Sb can be fully used.

Figure 7:
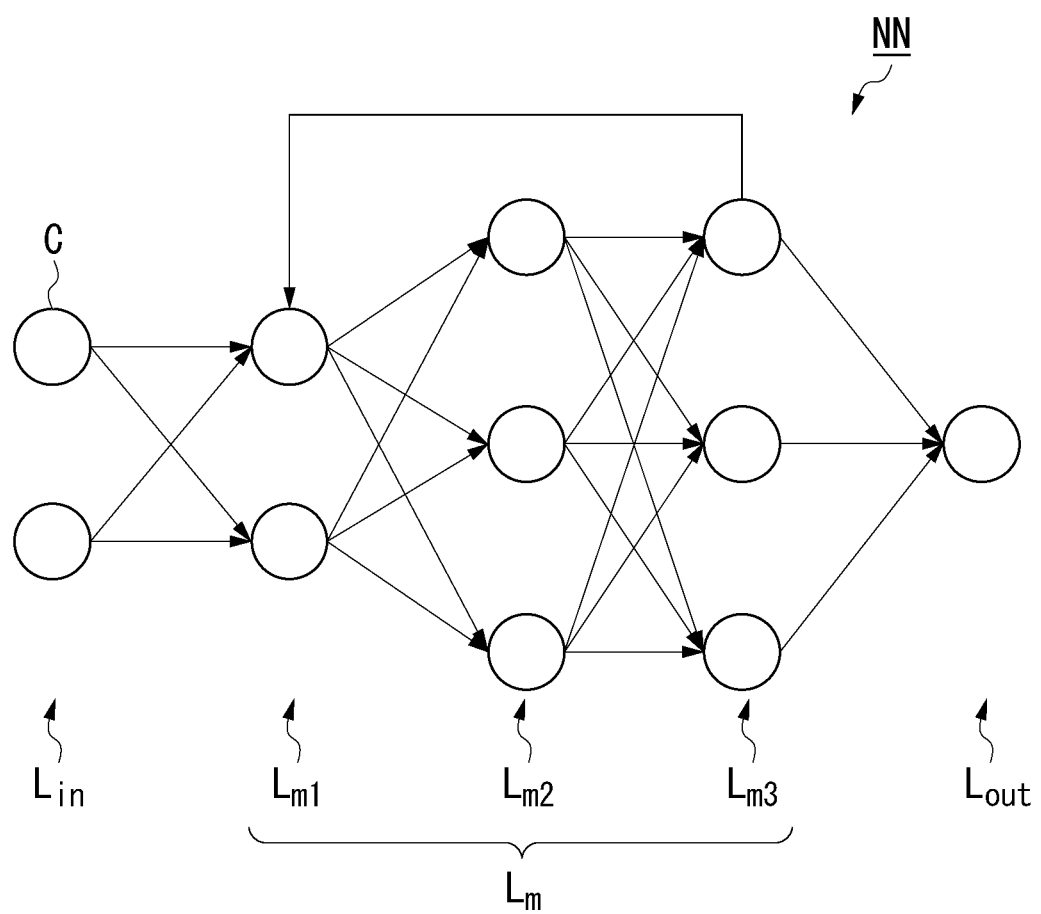
FIG. 7 is a schematic view of a neural network.

In addition, the integrated device 200 according to the first embodiment can be applied to a neuromorphic device. The neuromorphic device is a device that performs neural network operations. The neuromorphic device artificially imitates a relation between a neuron and a synapse in a brain of a human FIG. 7 is a schematic view of a neural network NN. The neural network NN includes an input layer $L_{in}$, intermediate layers $L_m$, and an output layer $L_{out}$. In FIG. 7, although an example in which the number of the intermediate layers $L_m$ is three is presented, the number of intermediate layers $L_m$ is arbitrary. Each of the input layer $L_{in}$, the intermediate layers $L_m$, and the output layer $L_{out}$ has a plurality of chips C, and each of the chips C corresponds to a neuron in a brain. Each of the input layer $L_{in}$, the intermediate layers $L_m$, and the output layer $L_{out}$ is connected to a transmission means. The transmission means corresponds to a synapse in a brain. In the neural network NN, the transmission means (synapse) performs learning, whereby a correct answer ratio of a problem increases. The learning is finding a knowledge that can be used in the future from information. The neural network NN performs learning by operating while changing a weight applied to the transmission means. The transmission means performs a product operation of applying a weight to an input signal and a sum operation of adding results of product operations. In other words, the transmission means performs product-sum operations.

The integrated device 200 according to the first embodiment can perform product-sum operations. A resistance value of the domain wall displacement element 100 changes in an analog manner in accordance with a change in the domain wall DW. Design of the resistance value of the domain wall displacement element 100 corresponds to giving a weight to the transmission means.

For example, a current is caused to flow from the read line RL to the common line CL. A current (output value) output from the common line CL differs in accordance with the resistance value (the weight) of the domain wall displacement element 100. In order words, applying of a current from the read line RL to the common line CL corresponds to a product operation in the neural network NN. The common line CL is connected to a plurality of domain wall displacement elements 100 belonging to the same column, and a current detected at an end of the common line CL is a value acquired by performing a sum operation on results of product operations performed by the domain wall displacement elements 100. Thus, the integrated device 200 functions as a product-sum operator of a neuromorphic device.

A current applied from each read line RL of the integrated device 200 is an input to the product-sum operator, and a current output from each common line CL of the integrated device 200 is an output from the product-sum operator. An input signal that is input to the product-sum operator may be controlled using a pulse width, a pulse height, or a pulse frequency.

For example, the neuromorphic device has an integrated device 200 and an output conversion unit. The output conversion unit has an activation function. The output conversion unit is disposed at an end of each common line CL. The output conversion unit converts a product-sum operation result output from the common line CL in accordance with the activation function.

The integrated device 200 may perform either one product-sum operation or a plurality of product-sum operations. In a case in which the integrated device 200 performs a plurality of product-sum operations, for example, a first element group belonging to a first hierarchical layer L1 may perform one product-sum operation, and a second element group belonging to a second hierarchical layer L2 may perform one product-sum operation.

Figure 8:
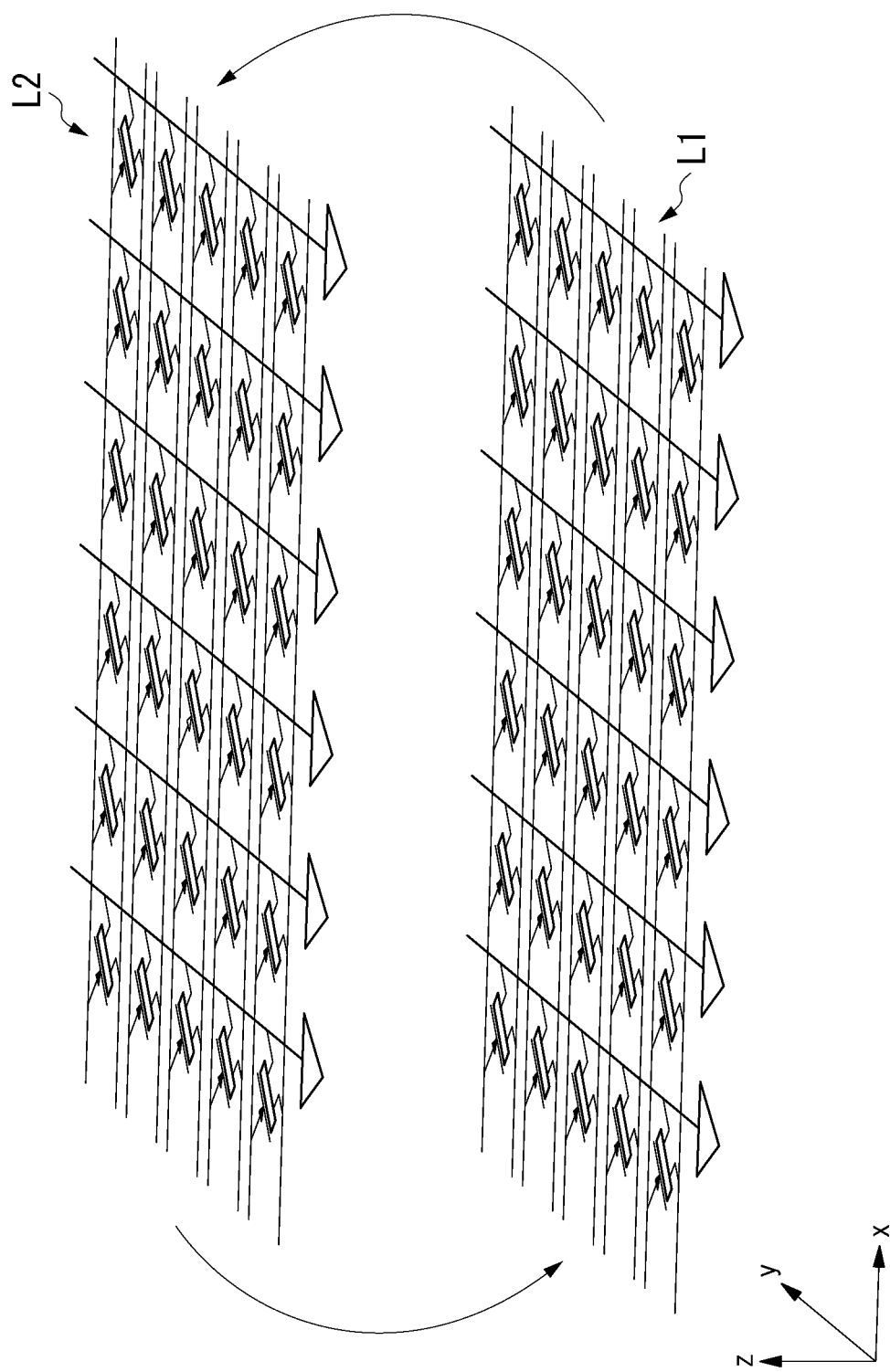
FIG. 8 is a circuit image diagram of a case in which an integrated device performs a different product-sum operation for each hierarchical layer.

FIG. 8 is a circuit image diagram of a case in which the integrated device 200 performs a different product-sum operation for each hierarchical layer. The first element group belonging to the first hierarchical layer L1 forms one product-sum operator, and the second element group belonging to the second hierarchical layer L2 forms one product-sum operator. Each product-sum operator has domain wall displacement elements 101 and 102 disposed in a matrix pattern and read lines RL, write lines WL, and common lines CL connected thereto.

As illustrated in FIG. 8, the product-sum operator of the first hierarchical layer L1 and the product-sum operator of the second hierarchical layer L2 may directly exchange signals. For example, an output of the product-sum operator of the first hierarchical layer L1 may be input to the product-sum operator of the second hierarchical layer L2. In other words, the output of the first element group may be input to the second element group. For example, each common line CL connected to the domain wall displacement element 101 of the first hierarchical layer L1 is connected to each read line RL2 connected to the domain wall displacement element 102 of the second hierarchical layer L2.

The inputting of the output of the product-sum operator of the first hierarchical layer L1 to the product-sum operator of the second hierarchical layer L2 represents using a product-sum operation result in the first hierarchical layer L1 for a product-sum operation in the second hierarchical layer L2. As illustrated in FIG. 7, the neural network NN performs a respective product-sum operation between the input layer $L_{in}$ and the first intermediate layer $L_{m1}$, between the first intermediate layer $L_{m1}$ and the second intermediate layer $L_{m2}$, between the second intermediate layer $L_{m2}$ and the third intermediate layer $L_{m3}$, and between the third intermediate layer $L_{m3}$ and the output layer $L_{out}$. In other words, in the neural network NN, a result of a previous product-sum operation is used for a later product-sum operation. As described above, when the first hierarchical layer L1 and the second hierarchical layer L2 are connected, the first element group is responsible for an operation between the first intermediate layer $L_{m1}$ and the second intermediate layer $L_{m2}$ in the neural network NN, and the second element group is responsible for an operation between the second intermediate layer $L_{m2}$ and the third intermediate layer $L_{m3}$ in the neural network NN. In other words, each of the first element group and the second element group is responsible for an operation between different intermediate layers in the neural network.

In addition, for example, the output of the product-sum operator of the second hierarchical layer L2 may be returned as the input of the product-sum operator of the first hierarchical layer L1 again. In other words, the output of the second element group may be input to the first element group. For example, each common line CL connected to the domain wall displacement element 102 of the second hierarchical layer L2 may be connected to each read line RL1 connected to the domain wall displacement elements 101 of the first layer L1. For example, such connecting corresponds to the process of returning a result of the third intermediate layer $L_{m3}$ to the first intermediate layer $L_{m1}$ in the neural network NN illustrated in FIG. 7. In other words, by performing such connecting, the integrated device 200 can realize a recurrent neural network. The recurrent neural network can handle data of a nonlinear time series.

Figure 9:
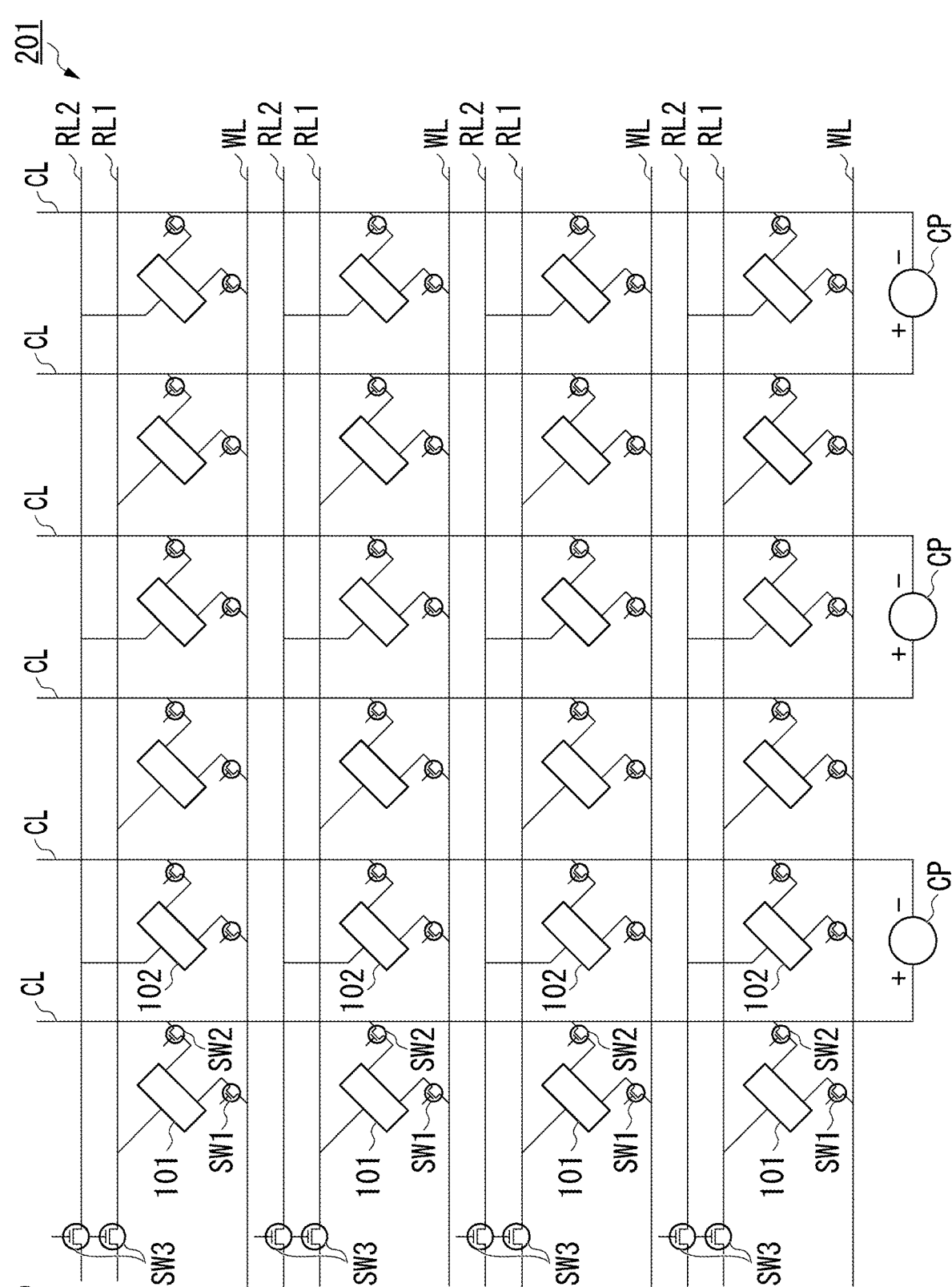
FIG. 9 is a circuit diagram of an integrated device according to a first modified example.

FIG. 9 is a circuit diagram of an integrated device 201 according to a first modified example. The integrated device 201 has a comparison device CP that is connected to two common lines CL. In the integrated device 201, signs of a weight applied to the domain wall displacement element 101 belonging to the first element group and a weight applied to the domain wall displacement element 102 belonging to the second element group are different from each other. The first element group of the first hierarchical layer L1 performs a product-sum operation having a positive weight. The first hierarchical layer L1 is called an activation layer. The second element group of the second hierarchical layer L2 performs a product-sum operation having a negative weight. The second hierarchical layer L2 is called a suppression layer. The sign of the weight can be freely changed by defining a case of the resistance values of the domain wall displacement elements 101 and 102 being a certain value as a weight of "0".

The comparison device CP compares an output of the first hierarchical layer L1 with an output of the second hierarchical layer L2 and outputs a result of the comparison (for example, a difference between output values). For example, the comparison device CP is an operational amplifier.

By comparing operation results acquired by using weights having different signs, the integrated device 201 can perform a more complex operation.

So far, although several examples of the first embodiment have been illustrated, but the present invention is not limited to such examples.

For example, a positional relation between the domain wall displacement element 101 and the domain wall displacement element 102 when seen in the z direction can be freely set.

Figure 10:
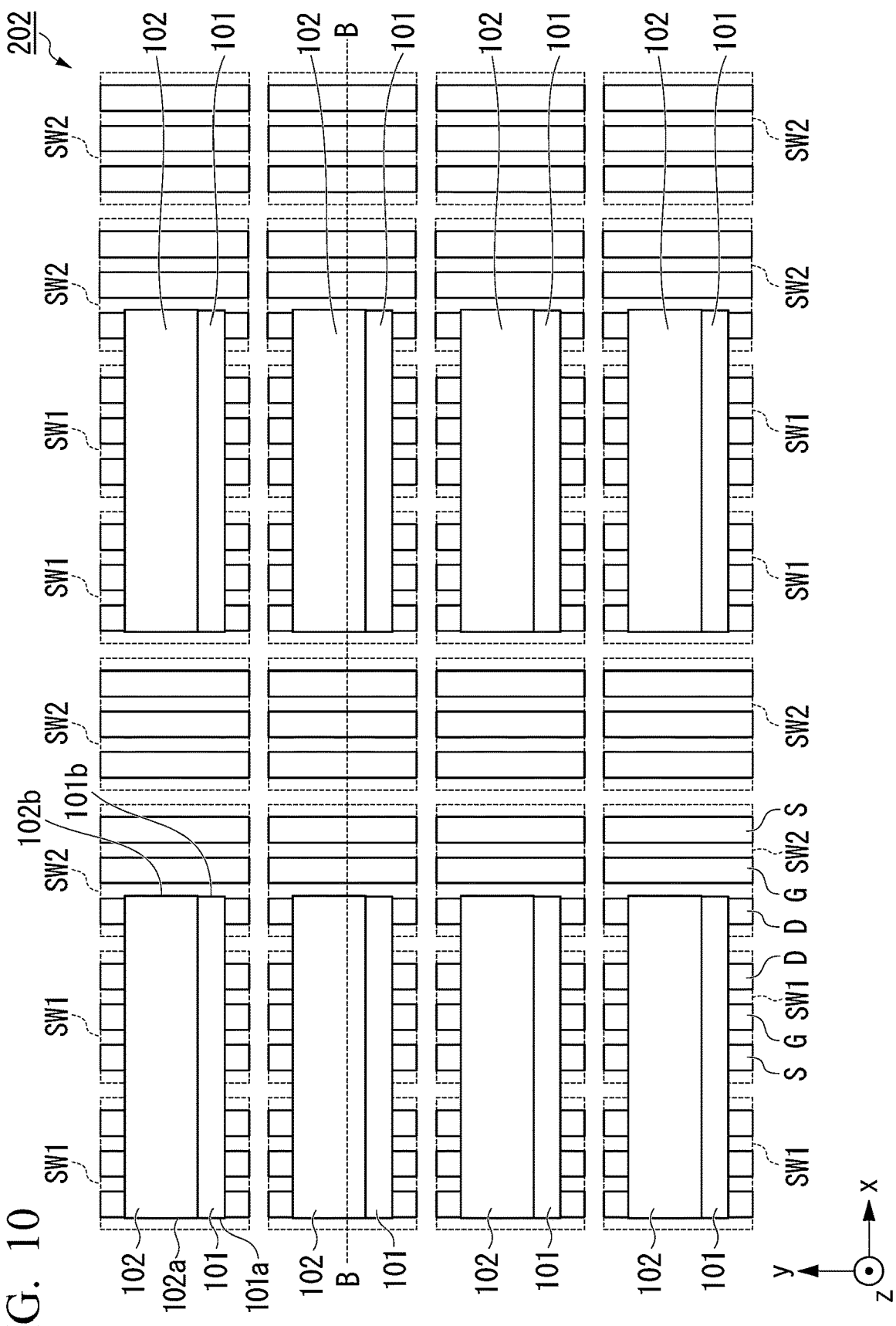
FIG. 10 is a plan view of characteristic parts of an integrated device according to a second modified example.
Figure 11:
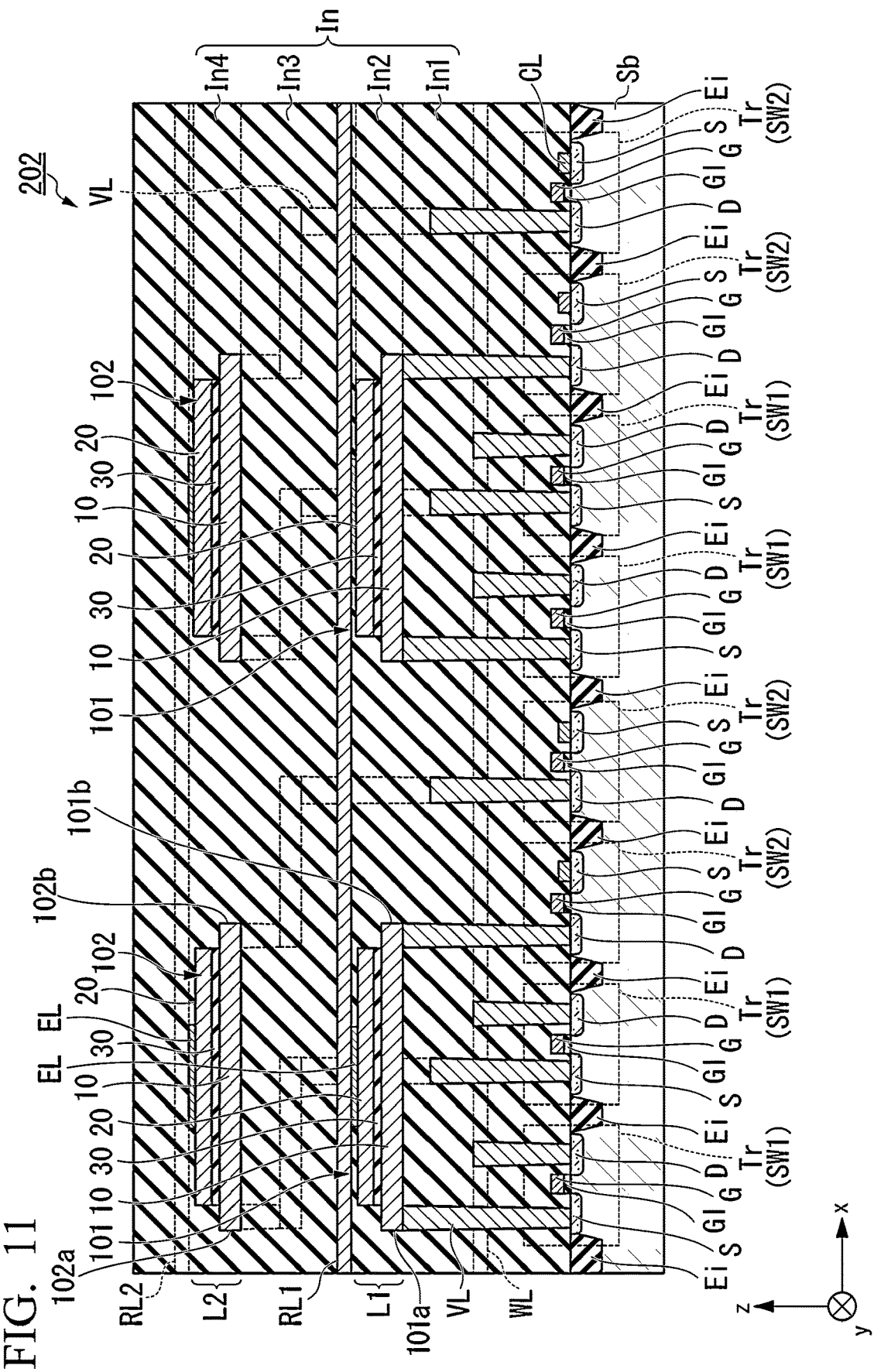
FIG. 11 is a cross-sectional view of characteristic parts of the integrated device according to the second modified example.

FIG. 10 is a plan view of characteristic parts of an integrated device 202 according to a second modified example. FIG. 10 is illustrated with read lines RL, write lines WL, and common lines CL excluded. FIG. 11 is a cross-sectional view of the characteristic parts of the integrated device 202 according to the second modified example. FIG. 11 illustrates an xy cross-section taken along line B-B illustrated in FIG. 10.

The positions of a first end 101a of a domain wall displacement element 101 and a first end 102a of a domain wall displacement element 102 illustrated in FIG. 10 in the x direction coincide with each other. The positions of the domain wall displacement element 101 and the domain wall displacement element 102 in the x direction can be also matched by routing a wiring between the elements.

Figure 12:
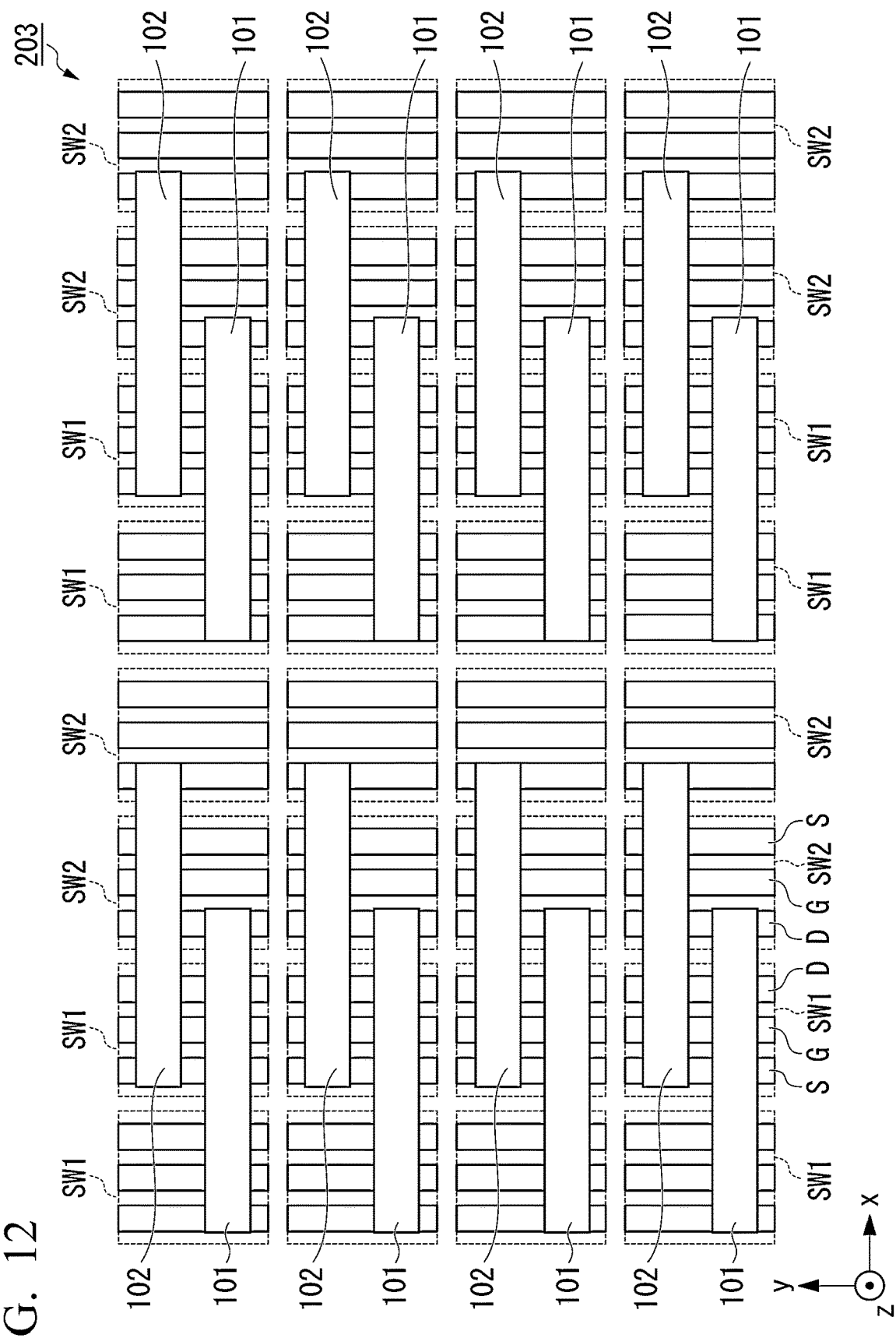
FIG. 12 is a plan view of characteristic parts of an integrated device according to a third modified example.
Figure 13:
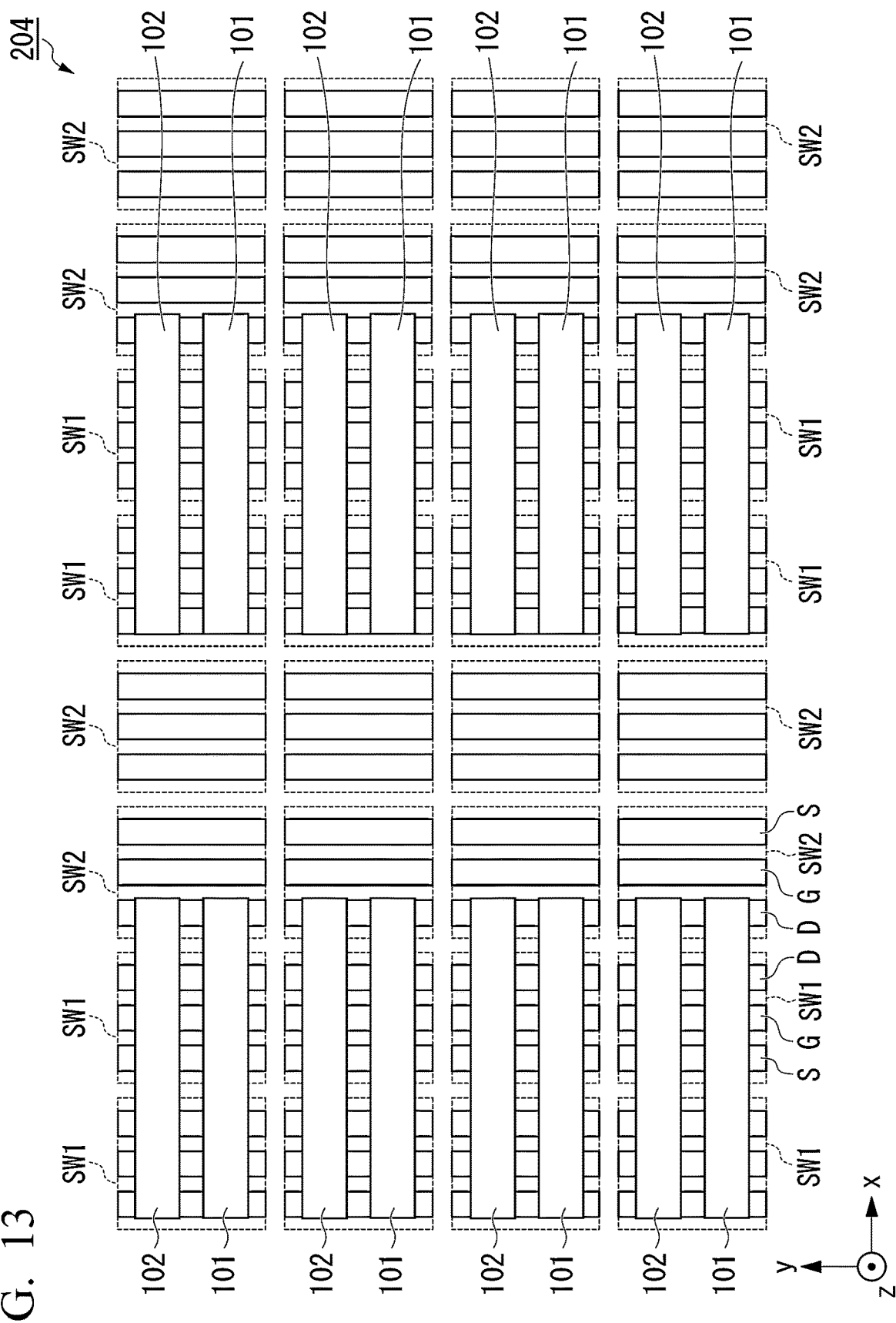
FIG. 13 is a plan view of characteristic parts of an integrated device according to a fourth modified example.

Like an integrated device 203 (third modified example) illustrated in FIG. 12 and an integrated device 204 (fourth modified example) illustrated in FIG. 13, the domain wall displacement element 101 and the domain wall displacement element 102 may not overlap each other in the z direction. The integrated device 203 illustrated in FIG. 12 is an example in which the domain wall displacement element 101 and the domain wall displacement element 102 do not overlap each other in the z direction, and the positions of the first end 101a and the first end 102a of the elements in the x direction deviate from each other. The integrated device 204 illustrated in FIG. 13 is an example in which the domain wall displacement element 101 and the domain wall displacement element 102 do not overlap each other in the z direction, and the positions of the first end 101a and the first end 102a of the elements in the x direction coincide with each other.

Figure 14:
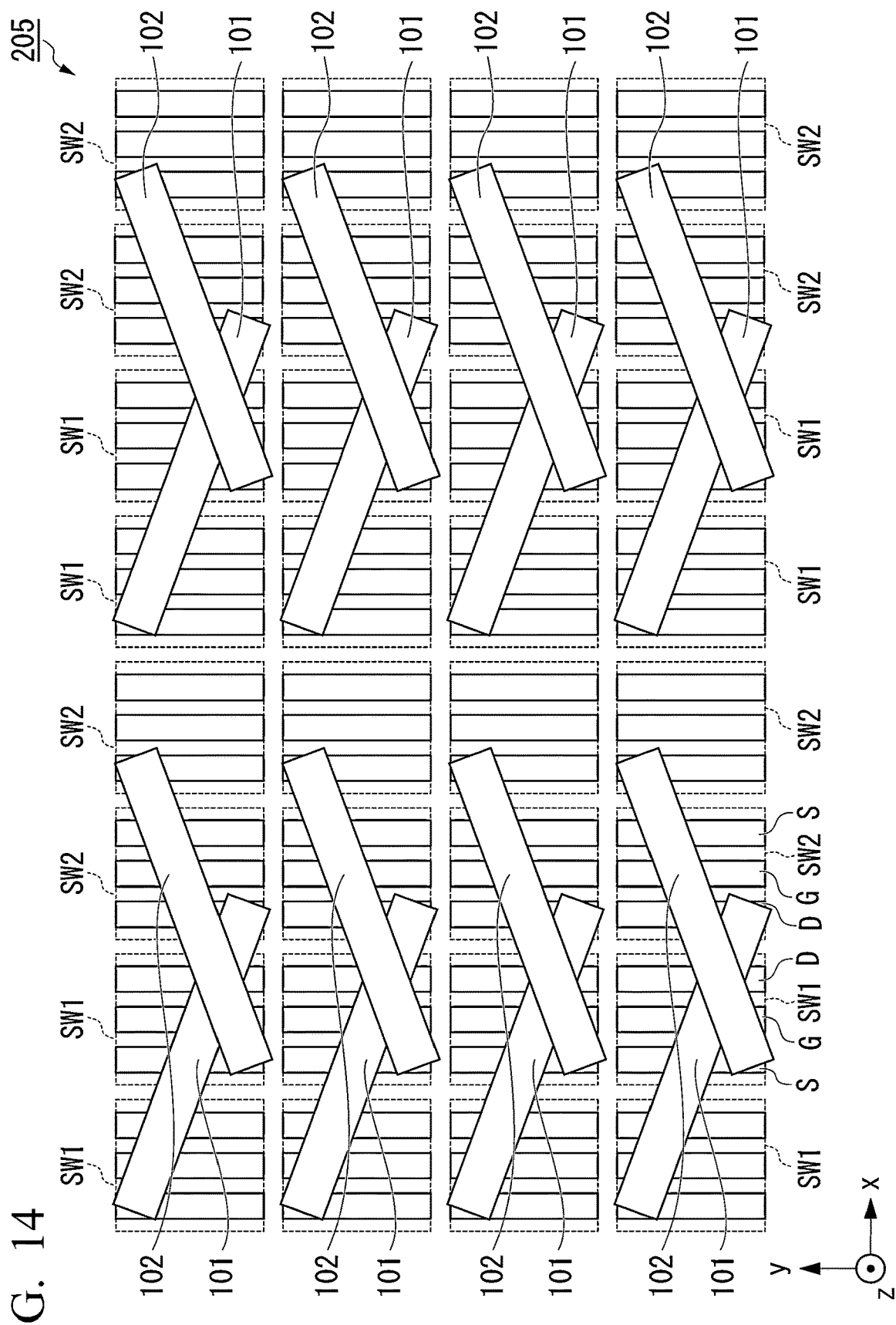
FIG. 14 is a plan view of characteristic parts of an integrated device according to a fifth modified example.

In addition, like an integrated device 205 (fifth modified example) illustrated in FIG. 14, the domain wall displacement element 101 and the domain wall displacement element 102 may intersect each other when seen in the z direction. A straight line connecting a first end and a second end of a conductive layer 10 of the domain wall displacement element 101 intersects a straight line connecting a first end and a second end of a conductive layer 10 of the domain wall displacement element 102. In addition, the domain wall displacement element 101 and the domain wall displacement element 102 partly overlap each other when seen in the z direction. By inclining the longitudinal direction of the domain wall displacement elements 101 and 102 with respect to a row direction and a column direction of transistors Tr, the conductive layer 10 can be designed to be long. In a case in which the length of the conductive layer 10 is large, a change rate of the resistance value of the domain wall displacement elements 101 and 102 becomes slow. In other words, the domain wall displacement elements 101 and 102 can realize changes in analog data more.

Figure 15:
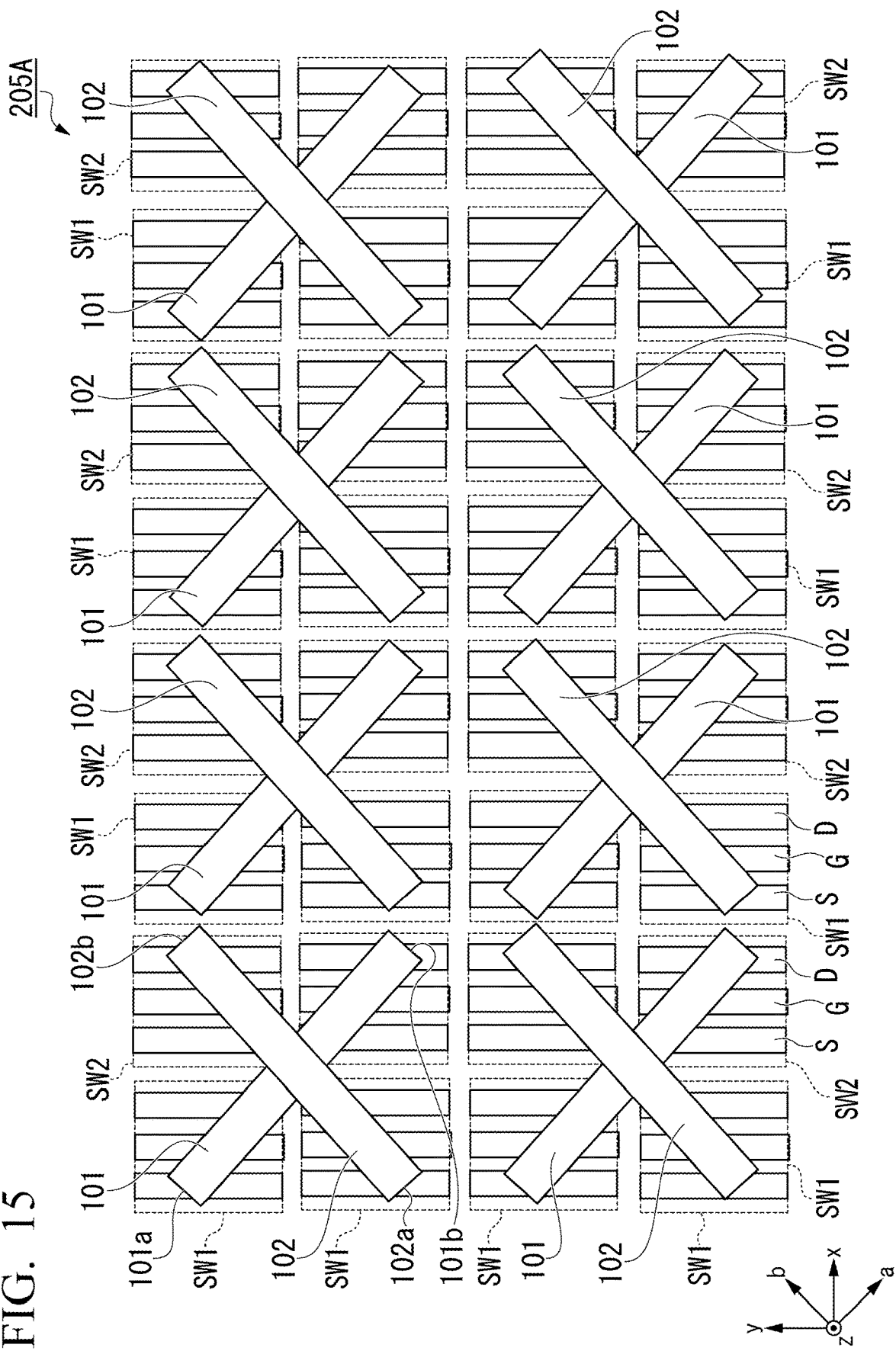
FIG. 15 is a plan view of characteristic parts of an integrated device according to another example of the fifth modified example.

An integrated device 205A illustrated in FIG. 15 is another example in which the domain wall displacement element 101 and the domain wall displacement element 102 intersect each other when seen in the z direction. In FIG. 15, a direction from a first switching element SW1 connected to the domain wall displacement element 101 to a second switching element SW2 connected to the domain wall displacement element 101 will be referred to as an a direction, and a direction from a first switching element SW1 connected to the domain wall displacement element 102 to a second switching element SW2 connected to the domain wall displacement element 102 will be referred to as a direction b. The a direction is a direction in which the conductive layer 10 of the domain wall displacement element 101 extends and is a direction from the first end 101a to the second end 101b. The direction b is a direction in which the conductive layer 10 of the domain wall displacement element 102 extends and is a direction from the first end 102a to the second end 102b.

A straight line connecting the first end and the second end of the conductive layer 10 of the domain wall displacement element 101 intersects a straight line connecting the first end and the second end of the conductive layer 10 of the domain wall displacement element 102. The domain wall displacement element 101 and the domain wall displacement element 102 partly overlap each other when seen in the z direction.

A first switching element SW1 and a second switching element SW2 connected to the domain wall displacement element 102 are present between a first switching element SW1 and a second switching element SW2 connected to the domain wall displacement elements 101 in the a direction. In addition, the first switching element SW1 and the second switching element SW2 connected to the domain wall displacement element 101 are present between the first switching element SW1 and the second switching element SW2 connected to the domain wall displacement elements 102 in the direction b.

Here, "a position of a switching element in the a direction" is a position acquired by projecting the position of the center of the switching element into an axis a. Thus, "C being present between A and B in the a direction" represents a positional relation in a case in which positions of A, B, and C are projected in the axis a, and A, B, and C do not need to be present on the same axis a. In the example illustrated in FIG. 15, the first switching element SW1 and the second switching element SW2 connected to the domain wall displacement element 102 are present at positions deviating from a segment connecting the first switching element SW1 and the second switching element SW2 connected to the domain wall displacement element 101 in the direction b.

The first switching element SW1 connected to the domain wall displacement element 101 and the second switching element SW2 connected to the domain wall displacement element 102 are alternately aligned in the x direction. The first switching element SW1 connected to the domain wall displacement element 101 and the first switching element SW1 connected to the domain wall displacement element 102 are alternately aligned in the y direction.

According to the integrated device 205A illustrated in FIG. 15, effects similar to those of the integrated device 205 illustrated in FIG. 14 can be acquired.

Figure 16:
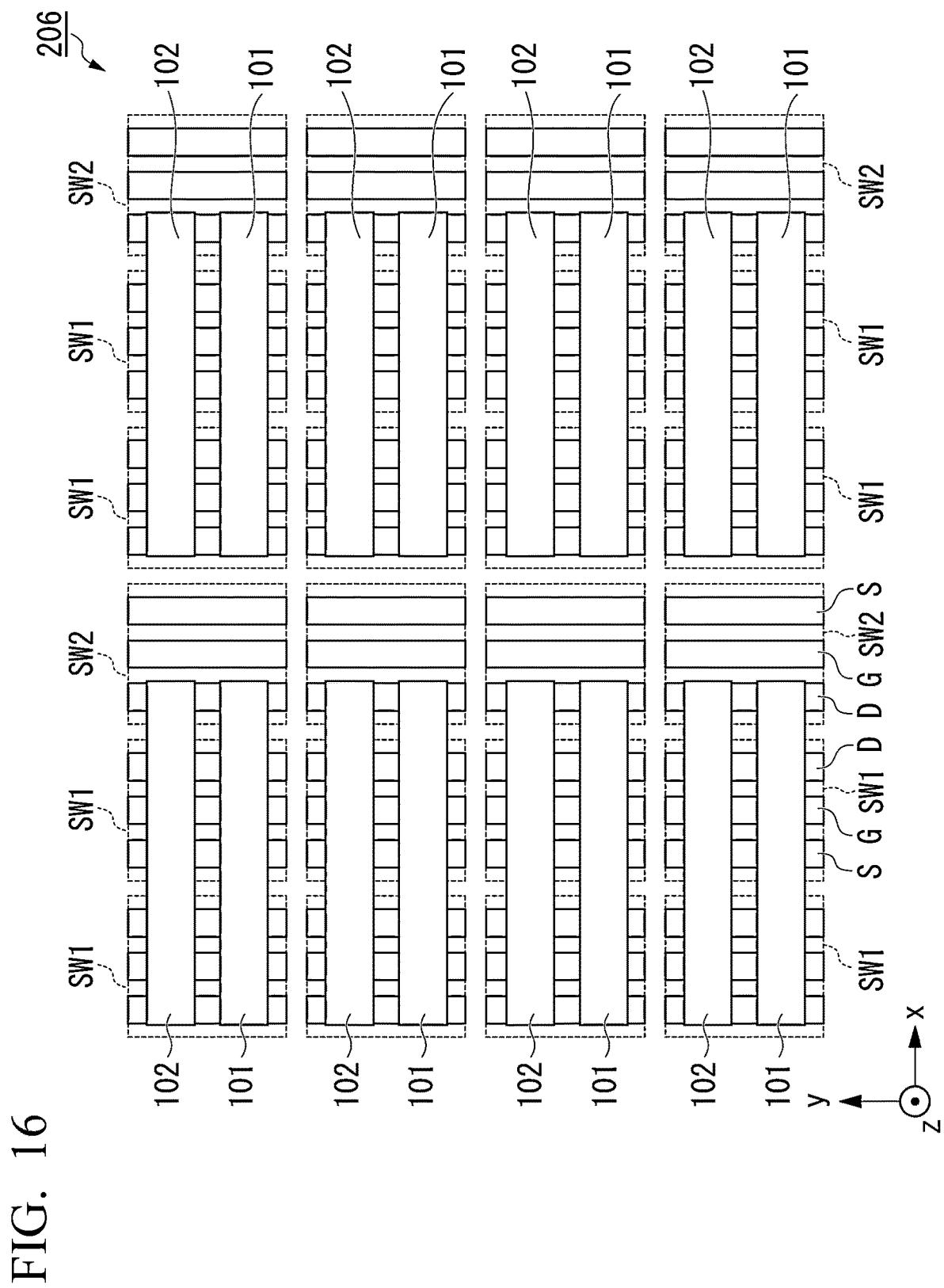
FIG. 16 is a plan view of characteristic parts of an integrated device according to a sixth modified example.
Figure 17:
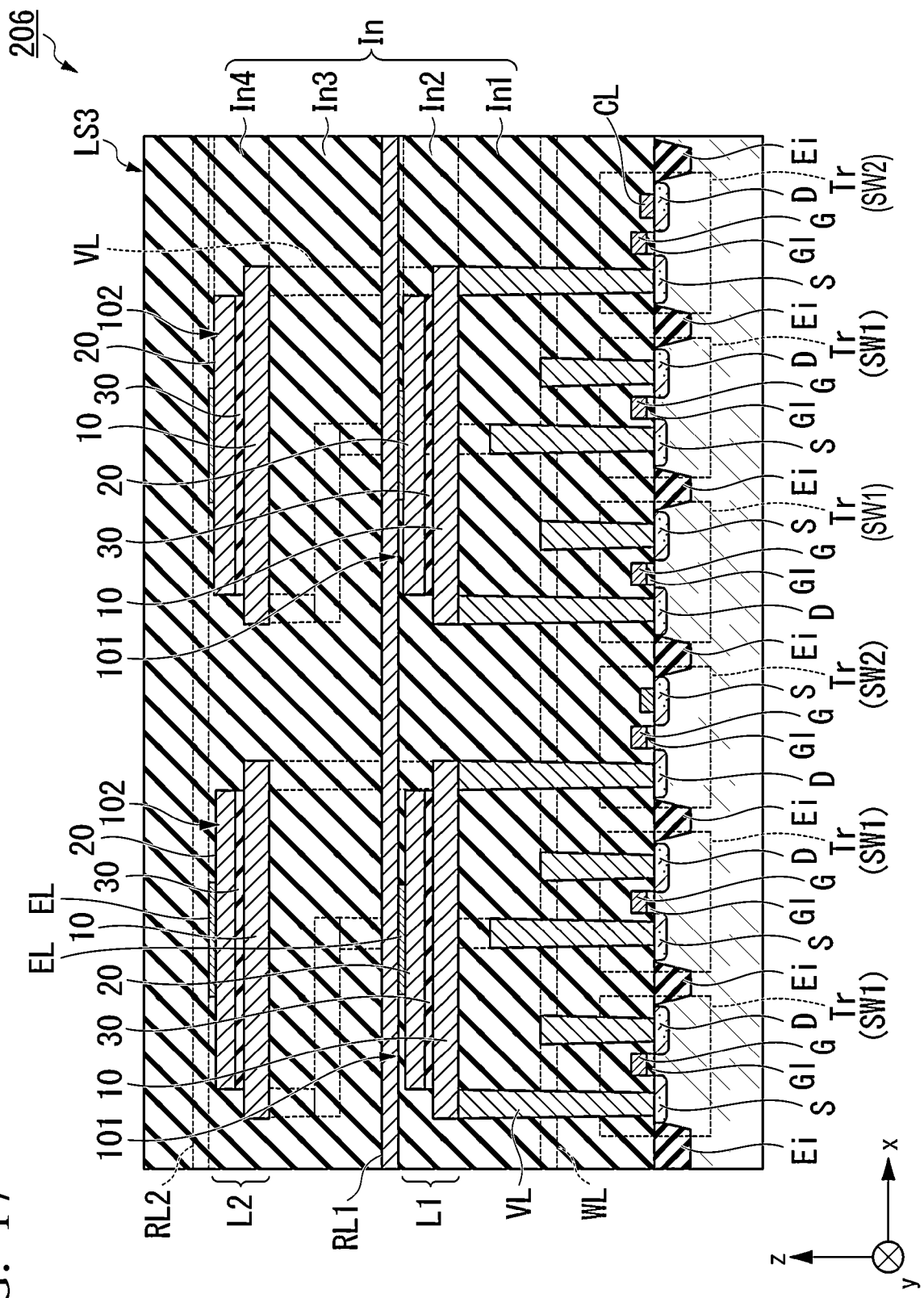
FIG. 17 is a cross-sectional view of characteristic parts of the integrated device according to the sixth modified example.

FIG. 16 is a plan view of characteristic parts of an integrated device 206 according to a sixth modified example. FIG. 16 is illustrated with read lines RL, write lines WL, and common lines CL excluded. FIG. 17 is a cross-sectional view of the characteristic parts of the integrated device 206 according to the sixth modified example.

In the integrated device 206 according to the sixth modified example, a domain wall displacement element 101 belonging to a first element group and a domain wall displacement element 102 belonging to a second element group are connected to the same second switching element SW2. This second switching element is the second switching element SW2 connected to the common line CL. In other words, the domain wall displacement element 101 and the domain wall displacement element 102 share the second switching element SW2 connected to the common line CL.

For example, a transistor Tr belonging to a first column aligned in the y direction is connected to a first end 101a of one domain wall displacement element 101 disposed in a first hierarchical layer L1. A transistor Tr belonging to a second column adjacent to the first column is connected to a first end 102a of one domain wall displacement element 102 disposed in a second hierarchical layer L2. A transistor Tr belonging to a third column adjacent to the second column is connected to a second end 101b of one domain wall displacement element 101 that is disposed in the first hierarchical layer L1 and is connected to the transistor Tr of the first column and a second end 102b of one domain wall displacement element 102 that is connected to the transistor Tr of the second column. The transistors Tr of the first column and the third column control the domain wall displacement elements 101, and the transistors Tr of the second column and the third column control the domain wall displacement elements 102.

By sharing the second switching element SW2 in two domain wall displacement elements 101 and 102, the number of switching elements required for controlling the domain wall displacement elements 101 and 102 can be decreased.

Figure 18:
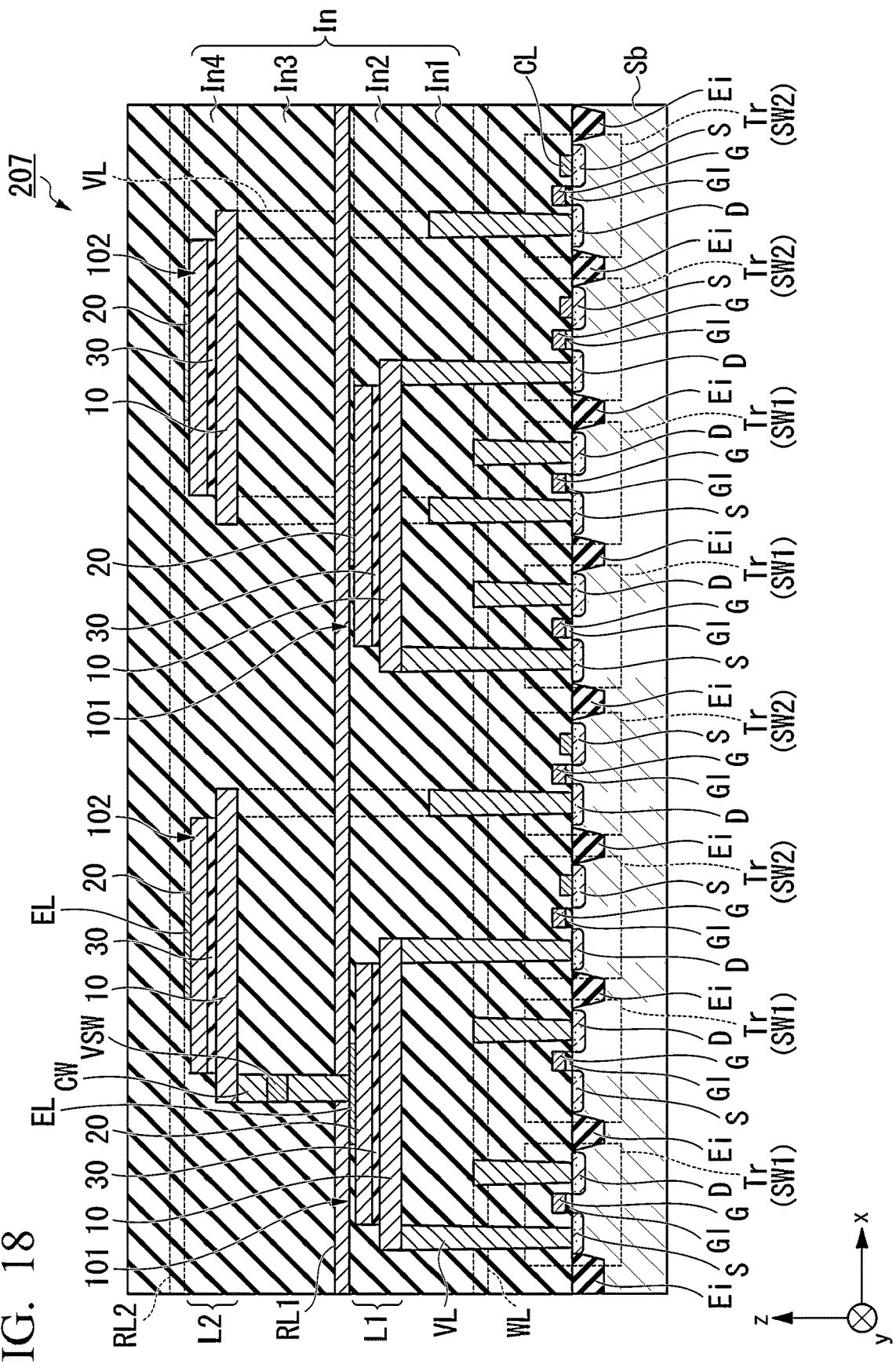
FIG. 18 is a cross-sectional view of characteristic parts of an integrated device according to a seventh modified example.

FIG. 18 is a cross-sectional view of characteristic parts of an integrated device 207 according to a seventh modified example. In the integrated device 207 according to the seventh modified example, one domain wall displacement element 101 belonging to a first element group and one domain wall displacement element 102 belonging to a second element group are connected through a connection wiring CW.

For example, the domain wall displacement elements 101 belonging to the first element group are connected to the domain wall displacement elements 102 belonging to the nearest second element group through the connection wirings CW without electrically passing through the substrate Sb. Not all the domain wall displacement elements 101 belonging to the first element group need to be connected to the domain wall displacement elements 102, and any one thereof may be connected thereto. For example, a ferromagnetic layer 20 of the domain wall displacement element 101 is connected to a conductive layer 10 of the domain wall displacement elements 102.

The connection wiring CW may have a vertical switching element VSW. The vertical switching element VSW is a switching element composed of laminated films stacked in the z direction. For example, an element using a phase change of a crystalline layer such as an ovonic threshold switch (OTS), an element using a change in the band structure such as a metal insulator transition (MIT) switch, an element using a breakdown voltage such as a Zener diode and an avalanche diode, and an element of which conductivity changes in accordance with a change in atomic positions are vertical switching elements VSW.

In a case in which the domain wall displacement element 101 and the domain wall displacement element 102 are connected using the connection wiring CW, a current path from the read line RL2 to the common line CL through the domain wall displacement elements 101 and 102 is formed. In other words, combined resistance acquired by combining the resistance value of the domain wall displacement element 101 and the resistance value of the domain wall displacement elements 102 can be read. In a neuromorphic device, the resistance values of the domain wall displacement elements 101 and 102 correspond to weights. The current path described above can represent a new weight acquired by combining the weights of two domain wall displacement elements 101 and 102. Thus, according to a neuromorphic device using the integrated device 207 of the seventh modified example, three weights can be represented using two domain wall displacement elements 101 and 102, and a more complex operation can be performed, whereby power of expression is improved.

Figure 19:
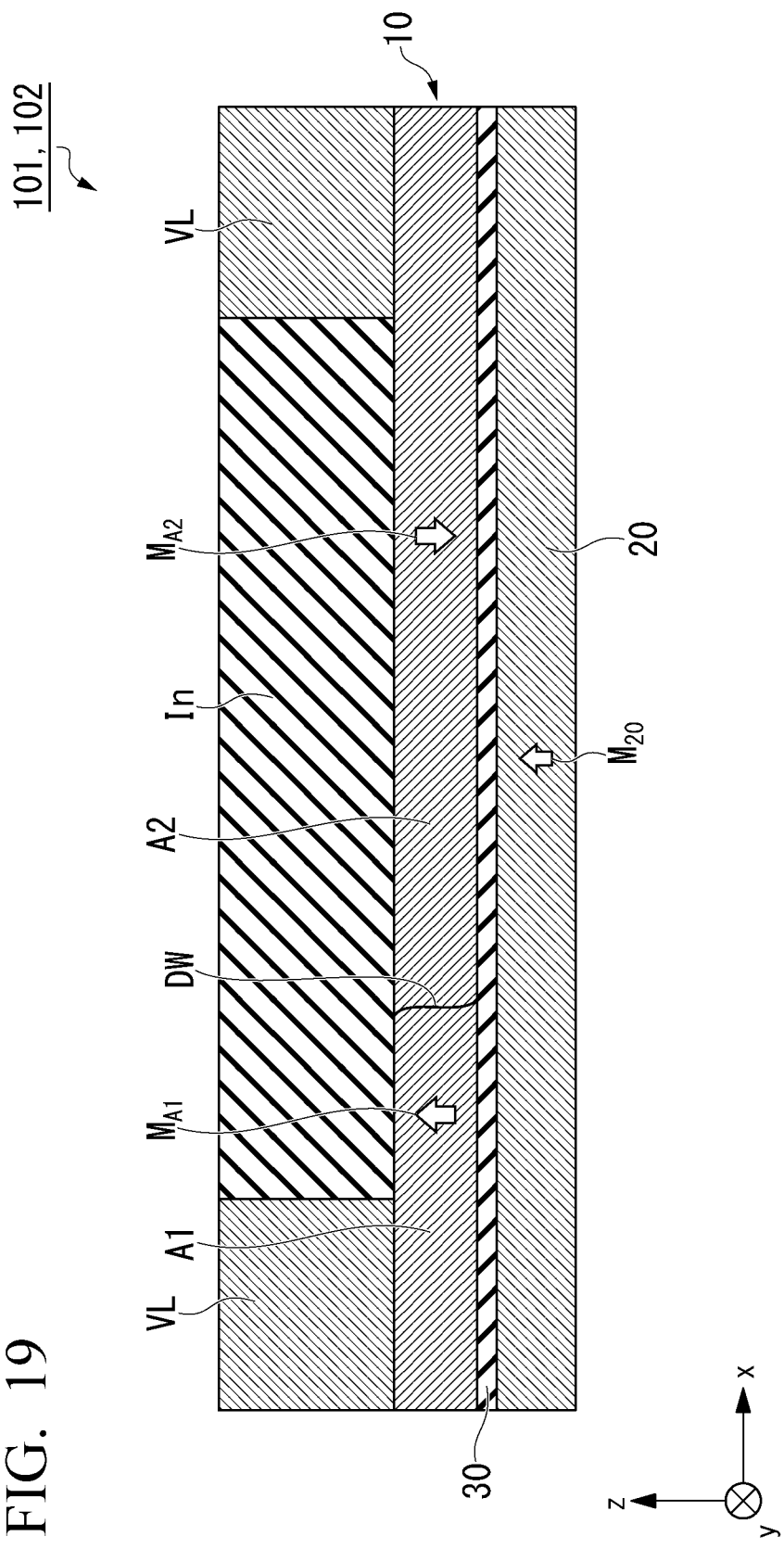
FIG. 19 is a cross-sectional view of domain wall displacement elements according to an eighth modified example.

For example, FIG. 19 is a cross-sectional view of domain wall displacement elements 101 and 102 of an integrated device according to an eighth modified example. As illustrated in FIG. 19, a conductive layer 10 may be present at a position away from a substrate Sb more than a ferromagnetic layer 20. FIG. 19 is referred to as a bottom pin structure in which the ferromagnetic layer 20 having relatively high stability of magnetization is present on a substrate Sb side. The bottom pin structure illustrated in FIG. 19 has higher stability of magnetization than the top pin structure illustrated in FIG. 6.

In addition, the element structure of the domain wall displacement element 101 belonging to the first element group, and the element structure of the domain wall displacement element 102 belonging to the second element group may be different from each other. For example, the domain wall displacement element 101 belonging to the first element group may have a top pin structure, and the domain wall displacement element 102 belonging to the second element group may have a bottom pin structure. To the contrary to this, the domain wall displacement element 101 belonging to the first element group may have a bottom pin structure, and the domain wall displacement element 102 belonging to the second element group may have a top pin structure.

Figure 20:
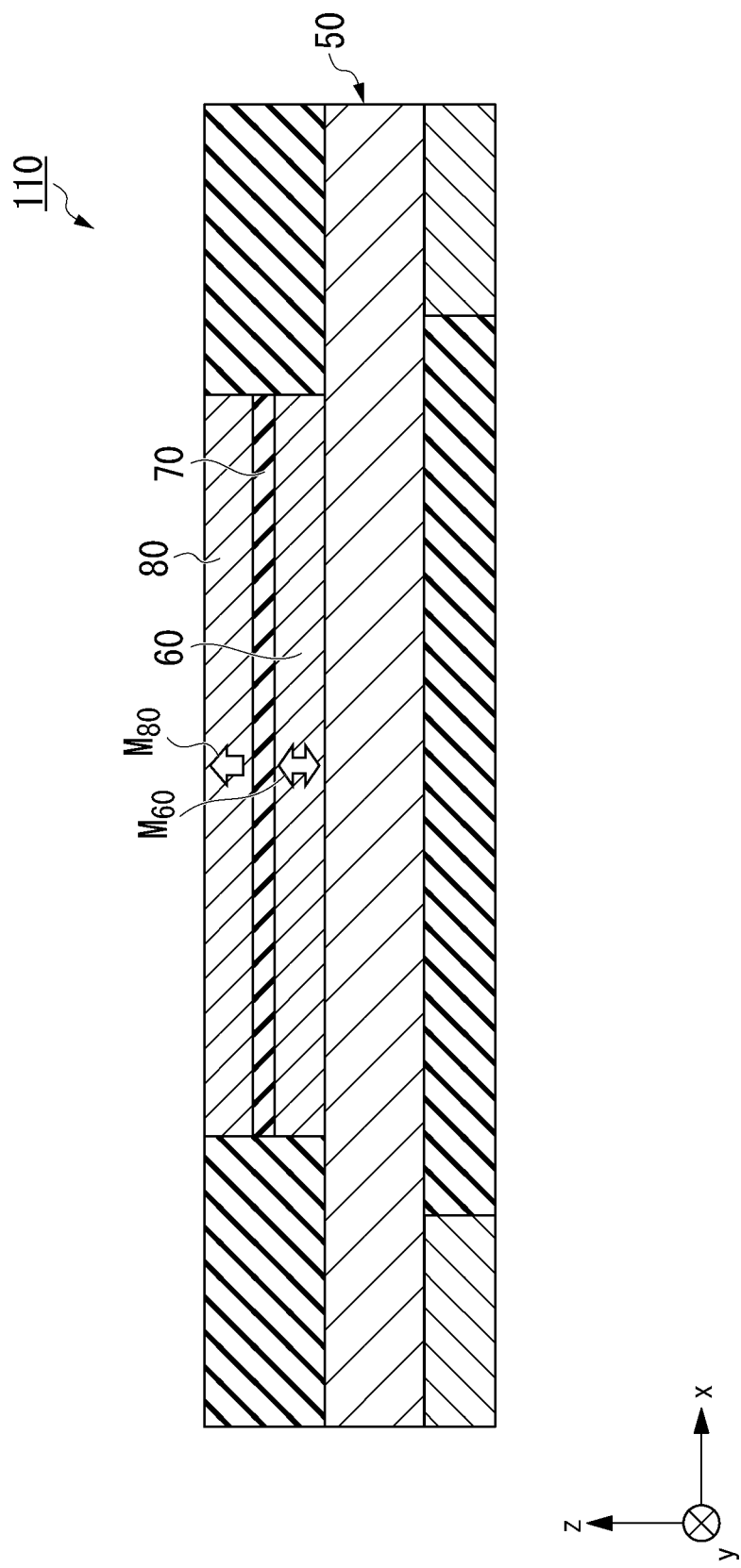
FIG. 20 is a cross-sectional view of a magnetoresistive effect element of a spin orbit torque type that is an example of a magnetic element.

So far, an example in which the domain wall displacement elements 100 are used as magnetic elements has been presented. The magnetic element may be a three terminal-type element and, for example, may be a magnetoresistive effect element 110 of a spin orbit torque type. FIG. 20 is a cross-sectional view of a magnetoresistive effect element 110 of a spin orbit torque type that is an example of a magnetic element.

The magnetoresistive effect element 110 of the spin orbit torque type has a conductive layer 50, a first ferromagnetic layer 60, a non-magnetic layer 70, and a second ferromagnetic layer 80. The magnetoresistive effect element 110 of the spin orbit torque type is a magnetoresistive effect element that performs magnetization reversal using a spin orbit torque. A resistance value of the magnetoresistive effect element 110 of the spin orbit torque type in the stacking direction changes in accordance with injection of a spin from the conductive layer 50 to the first ferromagnetic layer 60. The magnetoresistive effect element 110 of the spin orbit torque type may be referred to as a magnetoresistive effect element of a spin injection type or a spin current magnetoresistive effect element. In addition, the conductive layer 50 may be referred to as a spin orbit torque wiring.

The conductive layer 50 generates a spin current using a spin hall effect at the time of flow of a current and injects a spin to the first ferromagnetic layer 60. For example, the conductive layer 50 applies a spin orbit torque (SOT) that can cause reversal of magnetization $M_{60}$ of the first ferromagnetic layer 60 to magnetization $M_{60}$ of the first ferromagnetic layer 60.

The conductive layer 50 contains one of a metal, an alloy, an inter-metal compound, metal boride, metal carbide, metal silicide, and metal phosphide having a function of generating a spin current using a spin hall effect at the time of flow of a current.

For example, the conductive layer 50 contains a non-magnetic heavy metal as its main element. The main element is an element having a highest proportion among elements composing the conductive layer 50. For example, the conductive layer 50 contains a heavy metal having specific gravity that is equal to or higher than yttrium (Y). A non-magnetic heavy metal has a large atomic number equal to or greater than an atomic number 39 and has a d electron or an f electron in the outermost shell, and thus a spin orbit interaction strongly occurs. The spin hall effect is generated in accordance with a spin orbital interaction, a spin may be easily unevenly distributed inside the conductive layer 50, and a spin current $J_S$ may be easily generated. For example, the conductive layer 50 contains one selected from the group consisting of Au, Hf, Mo, Pt, W, and Ta.

For the first ferromagnetic layer 60 and the second ferromagnetic layer 80, the same material as that of the ferromagnetic layer 20 can be used. The first ferromagnetic layer 60 is a layer that becomes a trigger for data storage in accordance with a change in the direction of the magnetization M60. The first ferromagnetic layer 60 may be referred to as a magnetization free layer. A spin is injected from the conductive layer 50 to the first ferromagnetic layer 60. The second ferromagnetic layer 80 has a layer having magnetization $M_{80}$ that becomes a reference for the direction of the magnetization $M_{60}$ of the first ferromagnetic layer 60. In the magnetization $M_{80}$ of the second ferromagnetic layer 80, when a predetermined external force is applied, it is more difficult for the orientation direction to change than the magnetization $M_{60}$ of the first ferromagnetic layer 60. The second ferromagnetic layer 80 may be referred to as a magnetization fixed layer. A resistance value of the magnetoresistive effect element 110 of the spin orbit torque type changes in accordance with a difference between relative angles of magnetization of the first ferromagnetic layer 60 and the second ferromagnetic layer 80.

For the non-magnetic layer 70, the same material as that of the non-magnetic layer 30 described above can be used.

The magnetoresistive effect element 110 of the spin orbit torque type is a three terminal-type magnetoresistive effect element and has a length in the x direction that is larger than a length in the y direction. Thus, similar to the case of the domain wall displacement element 100, by forming the magnetoresistive effect element 110 of the spin orbit torque type in different hierarchical layers, the degree of integration of the integrated device can be increased.

Second Embodiment

Figure 21:
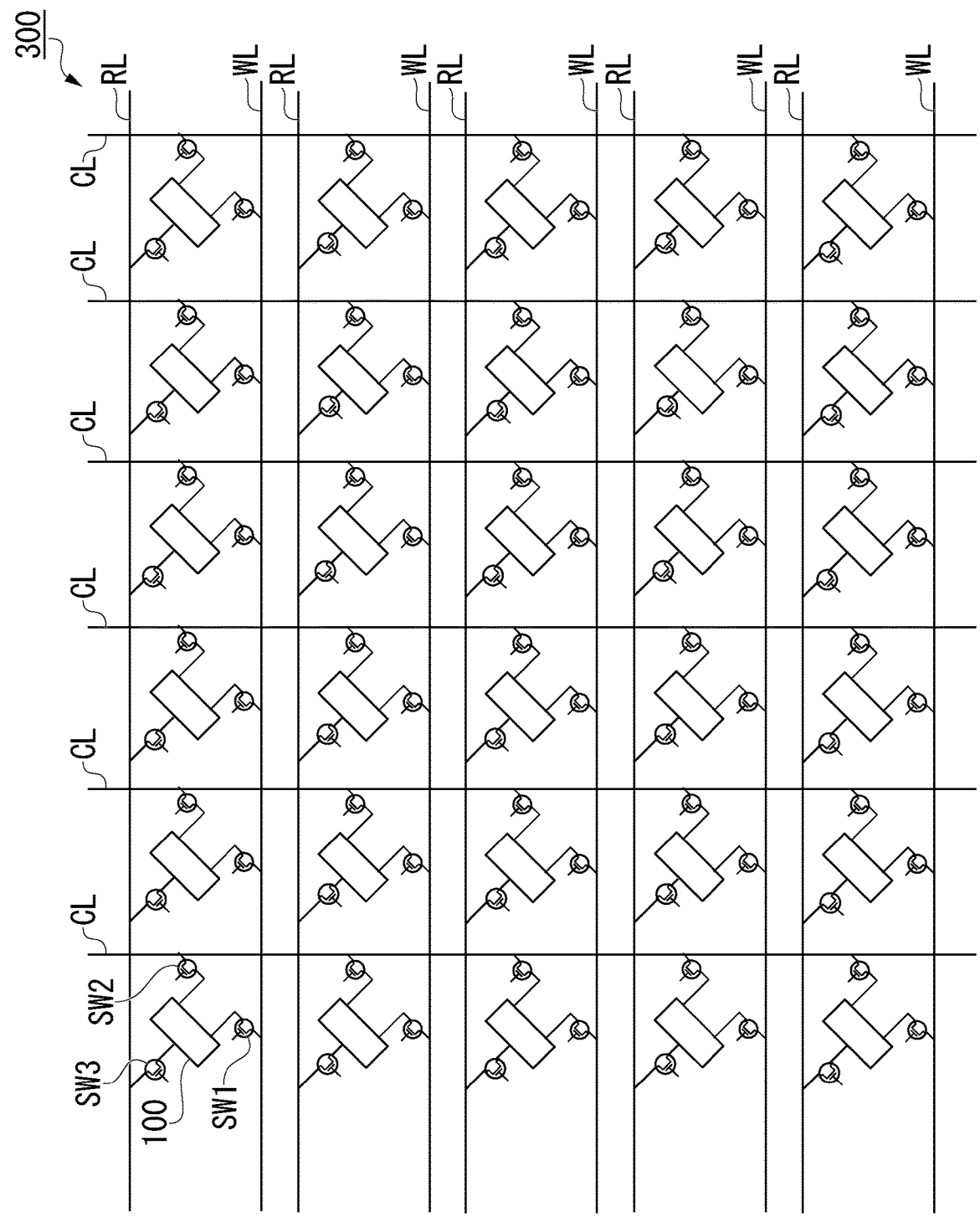
FIG. 21 is a circuit diagram of an integrated device according to a second embodiment.

FIG. 21 is a circuit diagram of an integrated device 300 according to a second embodiment. The integrated device 300 according to the second embodiment is different from the integrated device 200 according to the first embodiment in that a third switching element SW3 is present between a domain wall displacement element 100 thereof and a read line RL.

Figure 22:
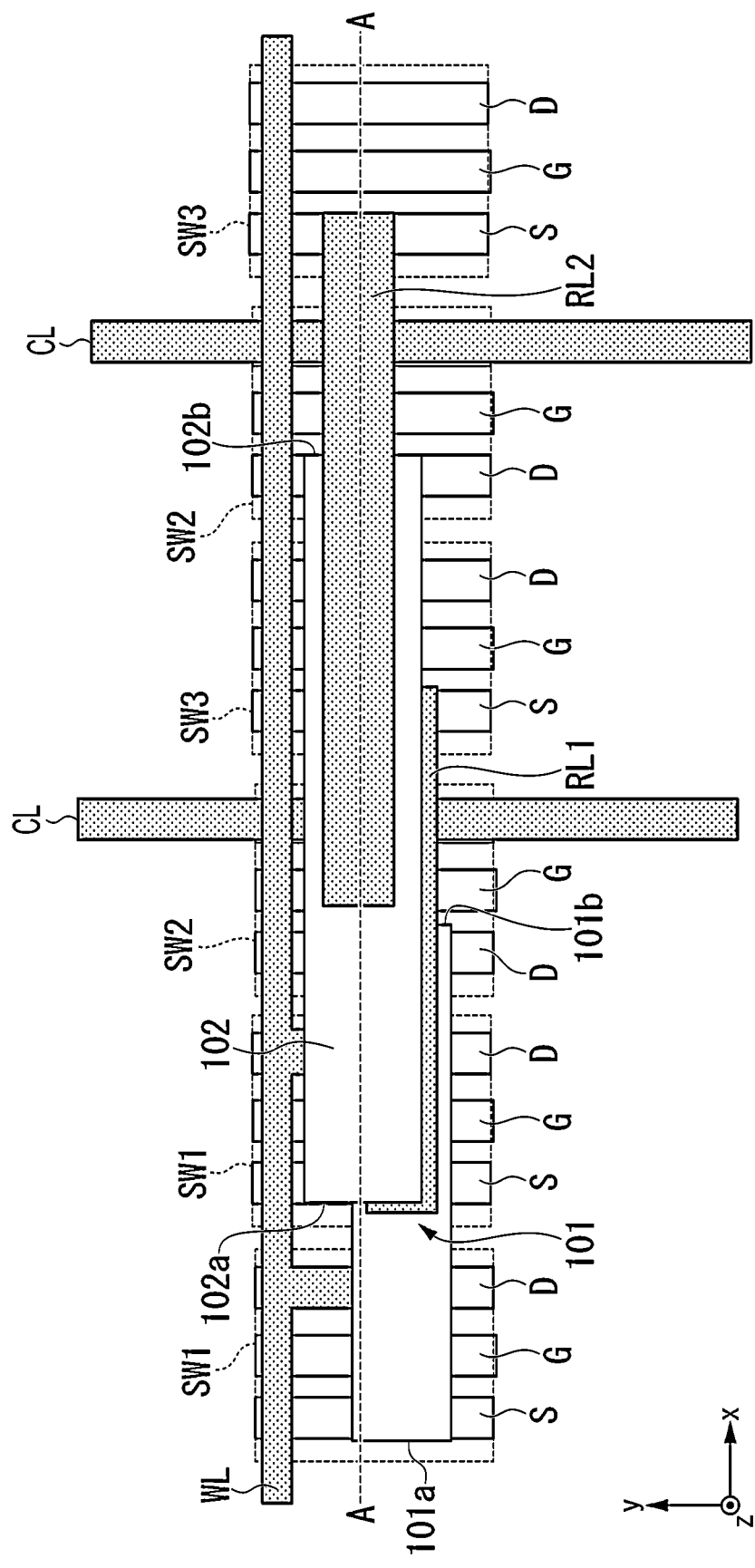
FIG. 22 is an enlarged plan view of an area near two magnetic elements of the integrated device according to the second embodiment.
Figure 23:
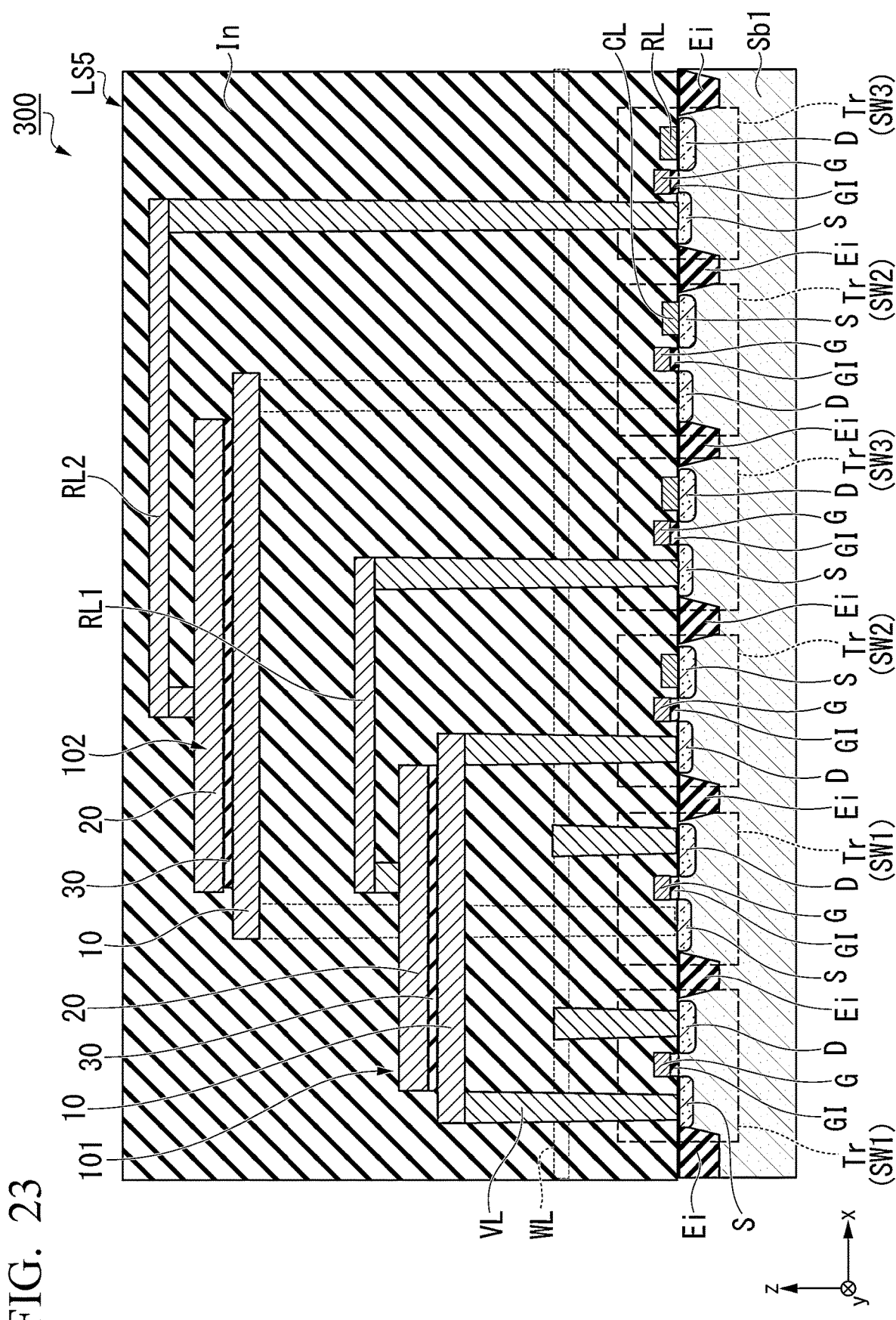
FIG. 23 is a cross-sectional view of characteristic parts of the integrated device according to the second embodiment.

FIG. 22 is an enlarged plan view of an area near two domain wall displacement elements 101 and 102 of the integrated device 300 according to the second embodiment. FIG. 23 is a cross-sectional view of characteristic parts of the integrated device 300 according to the second embodiment. FIG. 23 illustrates an xz cross-section taken along line A-A illustrated in FIG. 22.

The integrated device 300 includes a substrate Sb 1 and a laminated structural body LS5. In the substrate Sb1, a plurality of third switching elements SW3 are aligned, which is different from the substrate Sb according to the first embodiment. In the laminated structural body LS5, read lines RL1 and RL2 reaching the third switching elements SW3 are formed, which is different from the laminated structural body LS according to the first embodiment.

For example, a plurality of switching elements have first switching elements SW1, second switching elements SW2, and third switching elements SW3. The third switching elements SW3 are connected to ferromagnetic layers 20 of domain wall displacement elements 101 and 102 through the read lines RL1 and RL2. The read line RL1 is connected to the domain wall displacement element 101. The read line RL2 is connected to the domain wall displacement element 102.

The third switching element SW3 is a switching element that is used at the time of reading data. A current amount of a read current is smaller than a current amount of a write current. A current amount controlled by the third switching element SW3 is smaller than current amounts controlled by the first switching element SW1 and the second switching element SW2. In FIGS. 22 and 23, although the size of the third switching element SW3 is illustrated to be almost equal to the sizes of the first switching element SW1 and the second switching element SW2, the size of the third switching element SW3 may be smaller than the sizes of the first switching element SW1 and the second switching element SW2.

The first switching element SW1 connected to a second magnetic element that is one of the domain wall displacement elements 102 is present between the first switching element SW1 and the second switching element SW2 connected to a first magnetic element that is one of the domain wall displacement elements 101. In addition, the second switching element SW2 connected to the first magnetic element is present between the first switching element SW1 and the second switching element SW2 connected to the second magnetic element.

For example, transistors belonging to a first column are the first switching elements SW1 connected to the first magnetic element. For example, transistors belonging to a second column are the first switching elements SW1 connected to the second magnetic element. For example, transistors belonging to a third column are the second switching elements SW2 connected to the first magnetic element. For example, transistors belonging to a fourth column are the third switching elements SW3 connected to the first magnetic element. For example, transistors belonging to a fifth column are the second switching elements SW2 connected to the second magnetic element. For example, transistors belonging to a sixth column are the third switching elements SW3 connected to the second magnetic element. Such transistors are repeatedly aligned in this order in the x direction.

In the integrated device 300 according to the second embodiment, the third switching elements SW3 are disposed in the domain wall displacement elements 101 and 102, which is different from the integrated device 200 according to the first embodiment, and effects similar to those of the integrated device 200 according to the first embodiment can be acquired.

Here, although an example of the second embodiment has been illustrated, the present invention is not limited to this example.

Figure 24:
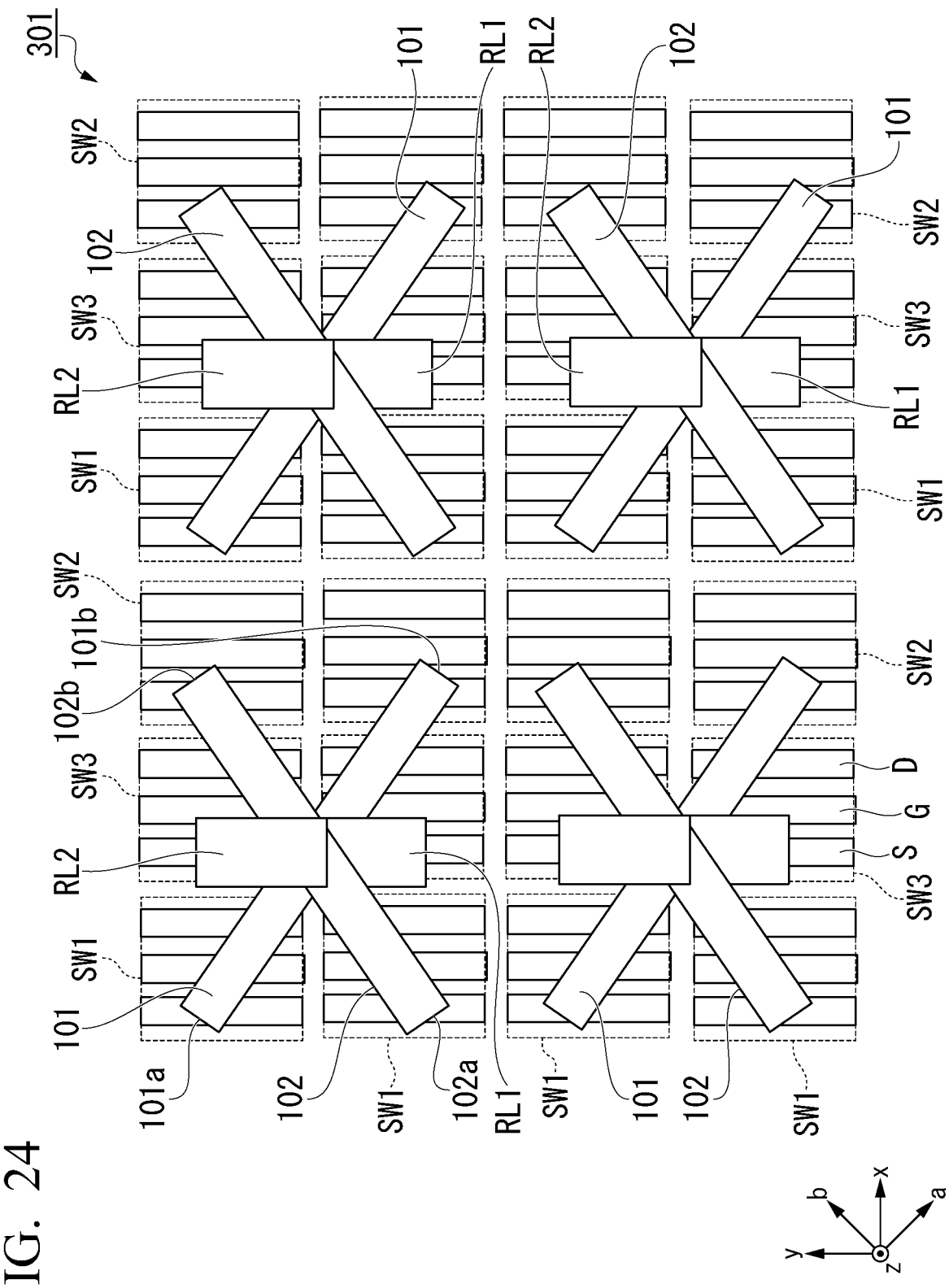
FIG. 24 is a plan view of characteristic parts of an integrated device according to a ninth modified example.

For example, as in the integrated device 301 illustrated in FIG. 24, the domain wall displacement element 101 and the domain wall displacement element 102 may intersect each other when seen in the z direction. A straight line connecting a first end and a second end of a conductive layer 10 of the domain wall displacement element 101 intersects a straight line connecting a first end and a second end of a conductive layer 10 of the domain wall displacement element 102.

The third switching element SW3 is present between the first switching element SW1 and the second switching element SW2 in the x direction. The third switching element SW3 connected to the domain wall displacement element 102 is present between the first switching element SW1 connected to the domain wall displacement element 101 and the second switching element SW2 connected to the domain wall displacement elements 102 in the x direction. The third switching element SW3 connected to the domain wall displacement element 101 is present between the first switching element SW1 connected to the domain wall displacement element 102 and the second switching element SW2 connected to the domain wall displacement elements 101 in the x direction. The domain wall displacement elements 101 and the third switching elements SW3 are connected using a read line RL1. The domain wall displacement elements 102 and the third switching elements SW3 are connected using a read line RL2.

A straight line connecting a first end and a second end of the conductive layer 10 of the domain wall displacement element 101 intersects a straight line connecting the first end and the second end of the conductive layer 10 of the domain wall displacement element 102. In addition, the domain wall displacement element 101 and the domain wall displacement element 102 partly overlap each other when seen in the z direction. The first switching element SW1 and the second switching element SW2 connected to the domain wall displacement element 102 are present between the first switching element SW1 and the second switching element SW2 connected to the domain wall displacement elements 101 in the a direction. In addition, the first switching element SW1 and the second switching element SW2 connected to the domain wall displacement element 101 are present between the first switching element SW1 and the second switching element SW2 connected to the domain wall displacement element 102 in the direction b.

The first switching element SW1 and the second switching element SW2 connected to the domain wall displacement element 102 are present at positions deviating from a segment connecting the first switching element SW1 and the second switching element SW2 connected to the domain wall displacement element 101 in the direction b.

Figure 25:
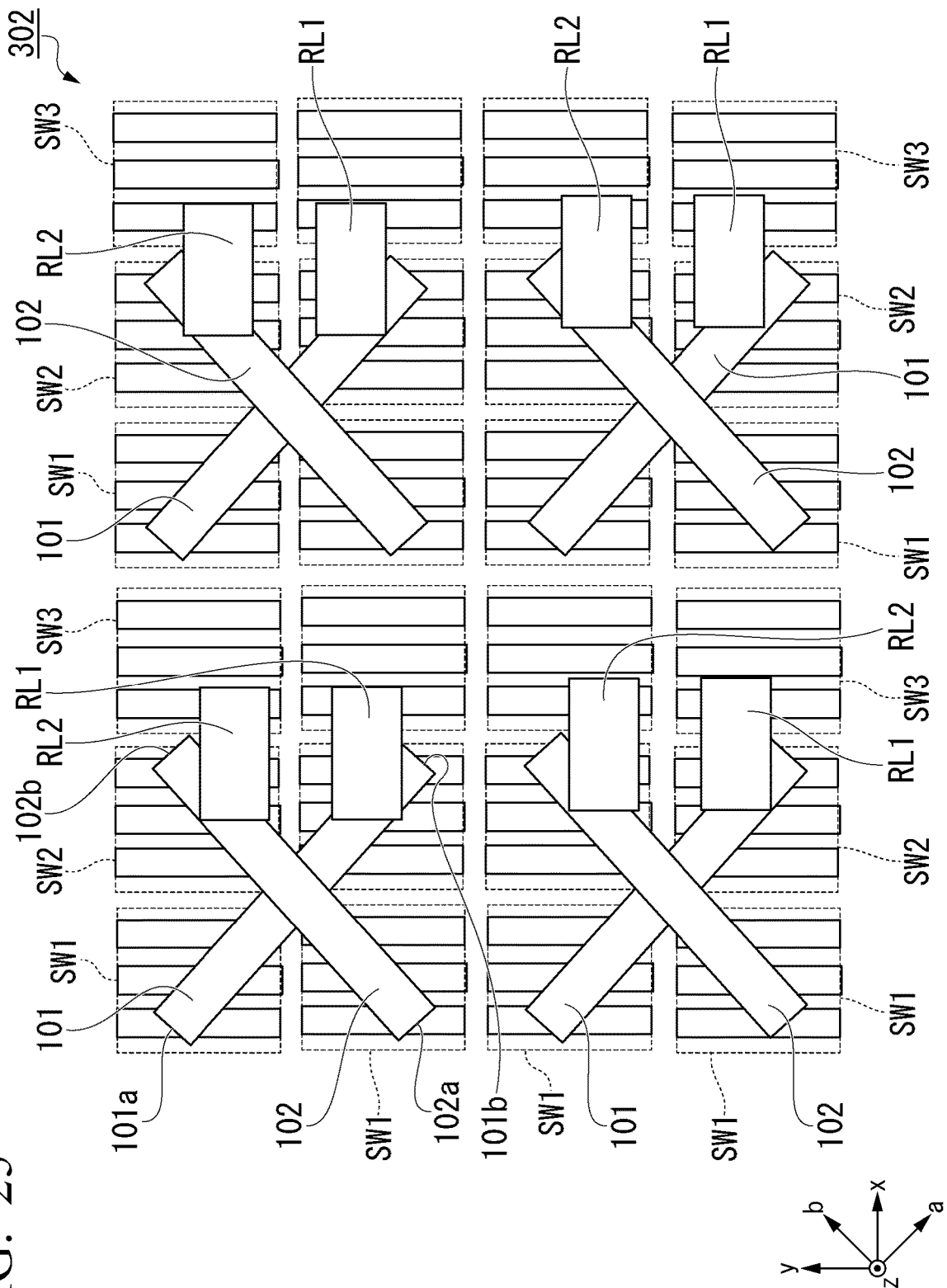
FIG. 25 is a plan view of characteristic parts of an integrated device according to a tenth modified example.

An integrated device 302 illustrated in FIG. 25 is a modified example of the integrated device 301 illustrated in FIG. 24. The third switching element SW3 is present on a side of the second switching element SW2 that is opposite to the first switching element SW1.

Figure 26:
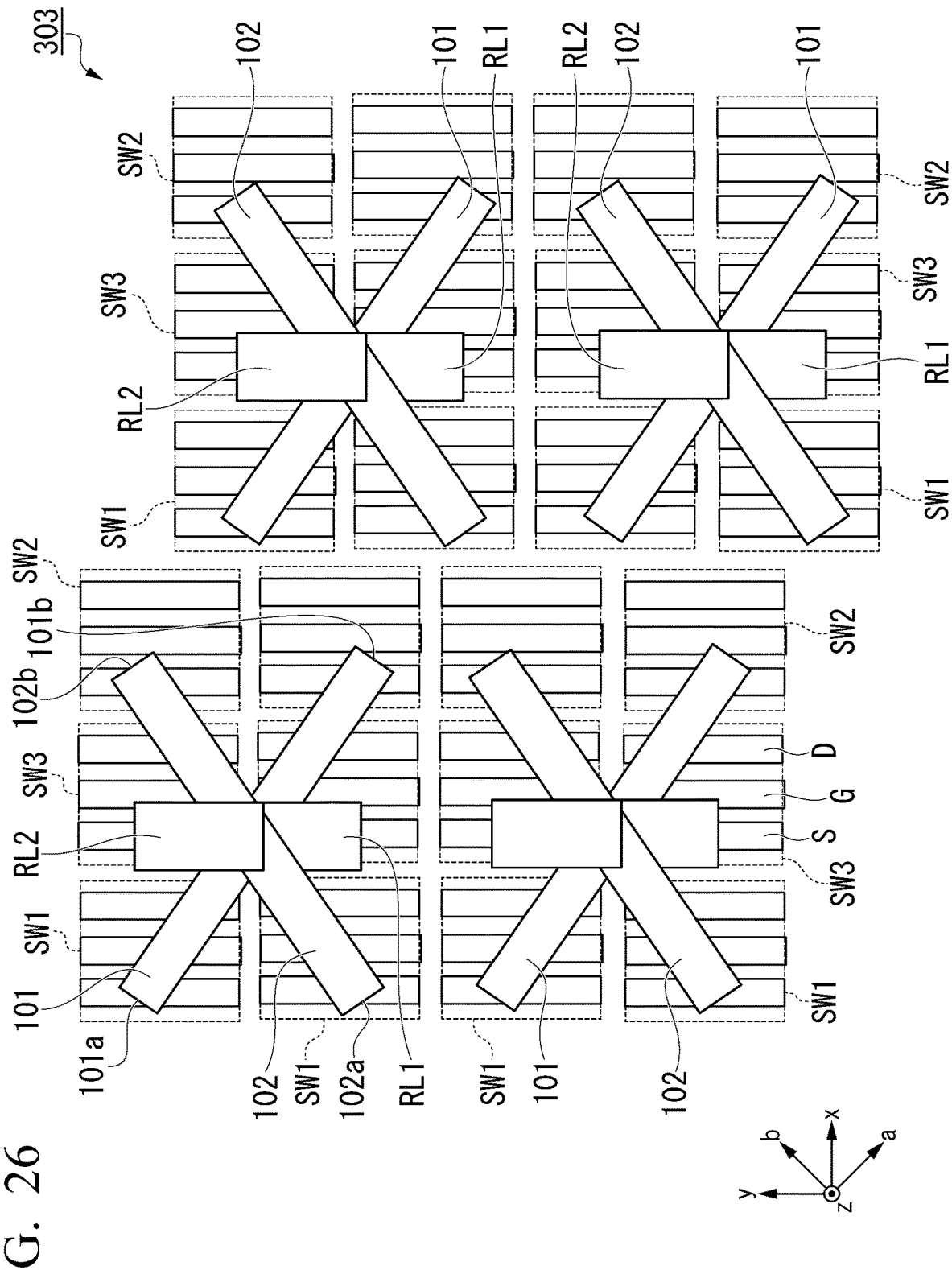
FIG. 26 is a plan view of characteristic parts of an integrated device according to an eleventh modified example.

An integrated device 303 illustrated in FIG. 26 is a modified example of the integrated device 301 illustrated in FIG. 24. In the integrated device 303 illustrated in FIG. 26, units of the first switching element SW1, the second switching element SW2, and the third switching element SW3 that control the domain wall displacement elements 101 and 102 deviate from each other in the y direction. When such units are aligned to deviate from each other in the y direction, an influence of the magnetization state of an end of each conductive layer 10 on the magnetization states of the ends of the conductive layers 10 of the domain wall displacement elements 101 and 102 of an adjacent unit can be reduced.

Figure 27:
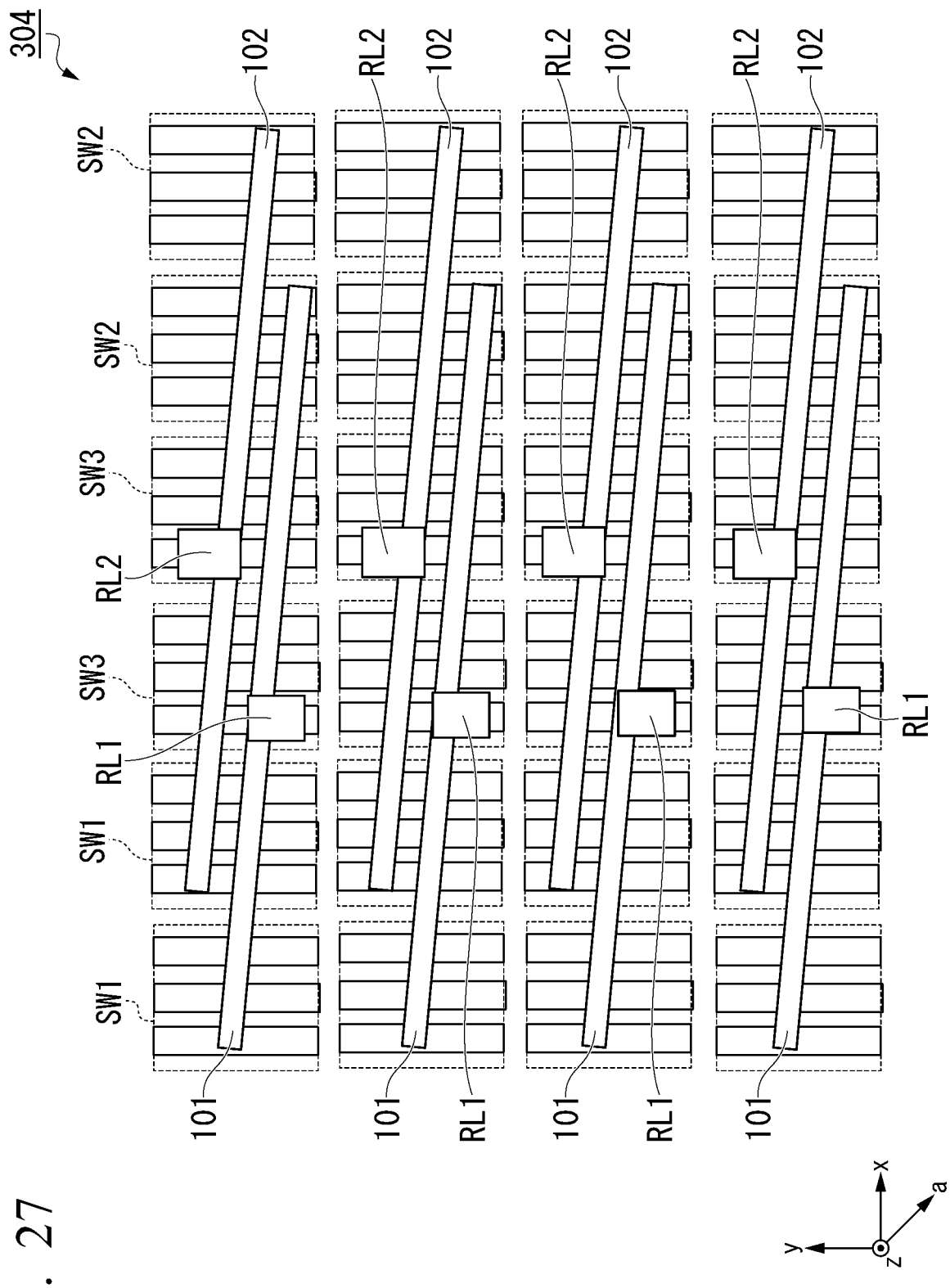
FIG. 27 is a plan view of characteristic parts of an integrated device according to a twelfth modified example.

Like an integrated device 304 illustrated in FIG. 27, the domain wall displacement element 101 and the domain wall displacement element 102 may not overlap each other when seen in the z direction. For example, the conductive layer 10 of the domain wall displacement element 101 and the conductive layer 10 of the domain wall displacement element 102 have an approximately parallel relation and are inclined with respect to the x direction and the y direction. In the integrated device 304, the third switching elements SW3 controlling the domain wall displacement elements 101 and 102 are present between the first switching element SW1 and the second switching element SW2 controlling the domain wall displacement element 101 in the x direction. In addition, the third switching elements SW3 controlling the domain wall displacement elements 101 and 102 are present between the first switching element SW1 and the second switching element SW2 controlling the domain wall displacement element 102 in the x direction.

As above, featured configurations of the embodiments and the modified examples thereof may be combined.

REFERENCE SIGNS LIST 10, 50 Conductive layer
20 Ferromagnetic layer
30, 70 Non-magnetic layer
60 First ferromagnetic layer
80 Second ferromagnetic layer
100, 101, 102 Domain wall displacement element
101a, 102a First end
101b, 102b Second end
110 Magnetoresistive effect element of spin orbit torque type
200, 201, 202, 203, 204, 205, 205A, 206, 207, 300, 301, 302, 303, 304 Integrated device
CP Comparison device
CL Common line
CW Connection wiring
L1 First hierarchical layer
L2 Second hierarchical layer
$L_{in}$ Input layer
$L_m$ Intermediate layer
$L_{m1}$ First intermediate layer
$L_{m2}$ Second intermediate layer
$L_{m3}$ Third intermediate layer
$L_{out}$ Output layer
LS Laminated structural body
NN Neural network
RL, RL1, RL2 Read line
Sb Substrate
SW1 First switching element
SW2 Second switching element
SW3 Third switching element
VSW Vertical switching element
WL Write line

What is claimed is:

1. An integrated device comprising:
a substrate; and
a laminated structural body stacked on the substrate,
wherein the substrate has a plurality of switching elements,
wherein the laminated structural body has a plurality of magnetic elements,
wherein the plurality of magnetic elements have a first element group disposed in a first hierarchical layer and a second element group disposed in a second hierarchical layer different from the first hierarchical layer,
wherein each of the plurality of magnetic elements includes a conductive layer and a laminated body including a ferromagnetic layer connected to the conductive layer,
wherein the plurality of switching elements include a plurality of first switching elements respectively connected to first ends of the conductive layers of the plurality of magnetic elements and a plurality of second switching elements respectively connected to second ends of the conductive layers of the plurality of magnetic elements, and
wherein a first switching element connected to a second magnetic element that is one of magnetic elements belonging to the second element group is present between a first switching element and a second switching element connected to a first magnetic element that is one of the magnetic elements belonging to the first element group in a first direction from the first switching element connected to the first magnetic element to the second switching element connected to the first magnetic element.

2. The integrated device according to claim 1, wherein the second switching element connected to the first magnetic element is present between the first switching element connected to the second magnetic element and a second switching element connected to the second magnetic element in the first direction.

3. The integrated device according to claim 1, wherein a straight line connecting the first end and the second end of the conductive layer of the first magnetic element intersects a straight line connecting the first end and the second end of the conductive layer of the second magnetic element.

4. The integrated device according to claim 1, wherein the first magnetic element and the second magnetic element partly overlap each other when seen in a stacking direction of the laminated structural body.

5. The integrated device according to claim 1, wherein the plurality of switching elements further include a plurality of third switching elements respectively connected to the laminated bodies of the plurality of magnetic elements.

6. The integrated device according to claim 1,
wherein the laminated structural body further includes an in-plane wiring that extends in one in-plane direction intersecting a stacking direction of the laminated structural body, and
wherein the in-plane wiring is present between the substrate and the first hierarchical layer or the second hierarchical layer and between the first hierarchical layer and the second hierarchical layer.

7. The integrated device according to claim 1, wherein one of the magnetic elements belonging to the first element group and one of the magnetic elements belonging to the second element group are connected through a wiring.

8. The integrated device according to claim 7, wherein the wiring has a vertical switching element.

9. The integrated device according to claim 1,
wherein the laminated structural body further includes a through wiring, and
wherein the through wiring connects different hierarchical layers or a specific hierarchical layer and the substrate.

10. The integrated device according to claim 1, wherein an output of the first element group is input to the second element group.

11. The integrated device according to claim 1, wherein the conductive layer includes a ferromagnetic substance, and the laminated body has a non-magnetic layer and the ferromagnetic layer in order from a side close to the conductive layer.

12. The integrated device according to claim 1, wherein the laminated body has a first ferromagnetic layer, a non-magnetic layer, and a second ferromagnetic layer in order from a side close to the conductive layer, and
wherein the first ferromagnetic layer is the ferromagnetic layer.

13. The integrated device according to claim 1,
wherein, in two magnetic elements that are adjacent in a second direction intersecting the first direction and that are present in different hierarchical layers, a position of the first end of the conductive layer of the magnetic element present in the first hierarchical layer and a position of the first end of the conductive layer of the magnetic element present in the second hierarchical layer in the first direction deviate from each other.

14. The integrated device according to claim 1,
wherein, in two magnetic elements that are adjacent in a second direction intersecting the first direction and that are present in different hierarchical layers, a position of the first end of the conductive layer of the magnetic element present in the first hierarchical layer and a position of the first end of the conductive layer of the magnetic element present in the second hierarchical layer in the first direction coincide with each other.

15. The integrated device according to claim 1, wherein one of the magnetic elements belonging to the first element group and one of the magnetic elements belonging to the second element group are connected to a same switching element.

16. A neuromorphic device comprising the integrated device according to claim 1.

17. The neuromorphic device according to claim 16, wherein each of the first element group and the second element group is responsible for an operation between different intermediate layers in a neural network.

18. The neuromorphic device according to claim 16, further comprising a comparison device comparing an output of the first element group with an output of the second element group,
wherein signs of a weight applied to the first element group and a weight applied to the second element group are different from each other.

19. An integrated device comprising:
a substrate; and
a laminated structural body stacked on the substrate,
wherein the substrate has a plurality of switching elements,
wherein the laminated structural body has a plurality of magnetic elements,
wherein the plurality of magnetic elements have a first element group disposed in a first hierarchical layer and a second element group disposed in a second hierarchical layer different from the first hierarchical layer,
wherein each of the plurality of magnetic elements includes a conductive layer and a laminated body including a ferromagnetic layer connected to the conductive layer,
wherein the plurality of switching elements include a plurality of first switching elements respectively connected to first ends of the conductive layers of the plurality of magnetic elements and a plurality of second switching elements respectively connected to second ends of the conductive layers of the plurality of magnetic elements,
wherein a direction from a first switching element connected to a first magnetic element that is one of magnetic elements belonging to the first element group to a second switching element connected to the first magnetic element is defined as a first direction,
wherein a direction that intersects the first direction is defined as a second direction,
wherein a straight line extending in the first direction through a center of the conductive layer of the first magnetic element in a width direction is a first straight line,
wherein a position acquired by projecting a position of a center of the first switching element connected to the first magnetic element into the first straight line is defined as a first position,
wherein a position acquired by projecting a position of a center of the second switching element connected to the first magnetic element into the first straight line is defined as a second position,
wherein a position acquired by projecting a position of a center of a first switching element connected to a second magnetic element that is one of magnetic elements belonging to the second element group into the first straight line is defined as a third position,
wherein the third position is between the first position and the second position, and
wherein the first switching element connected to the second magnetic element is present at a position deviating from the first straight line in the second direction.

* * * * *